US008804422B2

(12) United States Patent
Chung et al.

(10) Patent No.: US 8,804,422 B2
(45) Date of Patent: Aug. 12, 2014

(54) NONVOLATILE MEMORY DEVICE AND RELATED METHOD OF OPERATION

(71) Applicant: Samsung Electronics Co., Ltd., Suwon-Si (KR)

(72) Inventors: Ki Ho Chung, Suwon-si (KR); Sang-Soo Park, Hwaseong-si (KR); Ji-Suk Kim, Seoul (KR); Doo-Ho Cho, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 30 days.

(21) Appl. No.: 13/767,166

(22) Filed: Feb. 14, 2013

(65) Prior Publication Data

US 2013/0336057 A1 Dec. 19, 2013

(30) Foreign Application Priority Data

Jun. 19, 2012 (KR) ........................ 10-2012-0065620

(51) Int. Cl.
*G11C 11/34* (2006.01)
*G11C 16/10* (2006.01)
*G11C 16/34* (2006.01)
G11C 16/04 (2006.01)

(52) U.S. Cl.
CPC ........ *G11C 16/10* (2013.01); *G11C 2211/5621* (2013.01); *G11C 16/0483* (2013.01); *G11C 16/3459* (2013.01); *G01C 2213/71* (2013.01)
USPC ................................. 365/185.03; 365/185.24

(58) Field of Classification Search
USPC ....................................... 365/185.03, 185.24
See application file for complete search history.

(56) References Cited

U.S. PATENT DOCUMENTS

| 7,242,615 | B2 | 7/2007 | Nagashima | |
|---|---|---|---|---|
| 7,355,892 | B2 | 4/2008 | Hemink | |
| 7,843,723 | B2 | 11/2010 | Shibata | |
| 7,944,757 | B2 | 5/2011 | Moschiano et al. | |
| 2007/0121383 | A1* | 5/2007 | Chen et al. | ............... 365/185.19 |
| 2009/0273981 | A1* | 11/2009 | Moschiano et al. | ..... 365/185.19 |
| 2010/0031096 | A1 | 2/2010 | Di Iorio et al. | |
| 2011/0038215 | A1 | 2/2011 | Huh et al. | |
| 2011/0122692 | A1 | 5/2011 | Dutta et al. | |
| 2011/0134703 | A1 | 6/2011 | Li et al. | |
| 2012/0170363 | A1* | 7/2012 | Tsai et al. | ................ 365/185.03 |

FOREIGN PATENT DOCUMENTS

KR  10-0965076  6/2010

* cited by examiner

*Primary Examiner* — Michael Tran
(74) *Attorney, Agent, or Firm* — Volentine & Whitt, PLLC

(57) ABSTRACT

A method of programming selected memory cells to a plurality of target states comprises applying a first verification voltage to the selected memory cells to perform a verification read operation on memory cells programmed to at least one target state, applying a program voltage to the selected memory cells, and applying a second verification voltage lower than the first verification voltage to the selected memory cells to perform a verification read operation on memory cells programmed to the at least one target state, wherein the second verification voltage is provided in a specified program loop and subsequent program loops. The second verification voltage is set such that a number of slow bits in the at least one target state is different from the number of slow bits in another target state.

20 Claims, 17 Drawing Sheets

NONVOLATILE MEMORY DEVICE AND RELATED METHOD OF OPERATION

CROSS-REFERENCE TO RELATED APPLICATIONS

This application claims priority under 35 U.S.C. §119 to Korean Patent Application No. 10-2012-0065620 filed Jun. 19, 2012, the subject matter of which is hereby incorporated by reference.

BACKGROUND OF THE INVENTION

The inventive concept relates generally to electronic memory technologies. More particularly, certain embodiments of the inventive concept relate to nonvolatile memory devices and related methods of operation.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM). Examples of nonvolatile memory devices include electrically programmable erasable read only memory (EEPROM), mask read-only memory (MROM), and programmable ROM (PROM).

Flash memory is a type of EEPROM that is currently used in many applications for long term data storage. For example, flash memory devices are commonly used to store voice and image data in electronic devices such as computers, mobile phones, personal digital assistants (PDAs), digital cameras, camcorders, voice recorders, MP3 players, handheld personal computers (PCs), gaming machines, facsimile machines, scanners, and printers.

In recent years, there has been a general demand to increase the amount of data storage provided by flash memory devices and other forms of nonvolatile memory. One approach that has been adopted for this purpose is to design flash memory cells capable of storing more than one bit of data. A flash memory cell designed to store one bit of data is generally referred to as a single level cell (SLC), and a flash memory cell designed to store more than one bit of data is generally referred to as a multi-level cell (MLC). As the number of bits stored in each memory cell increases, stored data may become less reliable because a greater level of operational precision is required to store more bits per cell. Accordingly, researchers are engaged in continuing efforts to improve the reliability and other performance characteristics of MLCs.

SUMMARY OF THE INVENTION

In one embodiment of the inventive concept, a method of programming selected memory cells to a plurality of target states comprises applying a first verification voltage to the selected memory cells to perform a verification read operation on memory cells programmed to at least one target state, applying a program voltage to the selected memory cells, and applying a second verification voltage lower than the first verification voltage to the selected memory cells to perform a verification read operation on memory cells programmed to the at least one target state, wherein the second verification voltage is provided in a specified program loop and subsequent program loops. The second verification voltage is set such that a number of slow bits in the at least one target state is different from the number of slow bits in another target state.

In another embodiment of the inventive concept, a nonvolatile memory device comprises a cell array comprising memory cells to be programmed to a plurality of target states, a page buffer configured to sense selected ones of the memory cells through bit lines, a voltage generator configured to provide a program voltage or a verification voltage to a word line connected to the selected memory cells, and control logic configured to control the page buffer and the voltage generator such that allowable slow bit numbers applied respectively to the target states are different from one another where the selected memory cells are programmed to at least one of the target states.

In another embodiment of the inventive concept, a method of programming a nonvolatile memory device comprises defining a slow bit tolerance for memory cells in the nonvolatile memory device, programming the memory cells to at least one target state by performing a plurality of program loops each comprising a program step and a verification step, during the programming, determining whether a number of the program loops or the program voltage has reached a predetermined level, and upon determining that the number of the program loops or the program voltage has reached the predetermined level, modifying a verification voltage for the at least one target state according to the slow bit tolerance.

These and other embodiments of the inventive concept can potentially improve the reliability of MLC nonvolatile memory devices by performing program operations in a flexible manner according to the presence of slow bits.

BRIEF DESCRIPTION OF THE DRAWINGS

The drawings illustrate selected embodiments of the inventive concept. In the drawings, like reference numbers indicate like features. In addition, the relative dimensions of certain features may be exaggerated for clarity of illustration.

DETAILED DESCRIPTION

Figure 1:
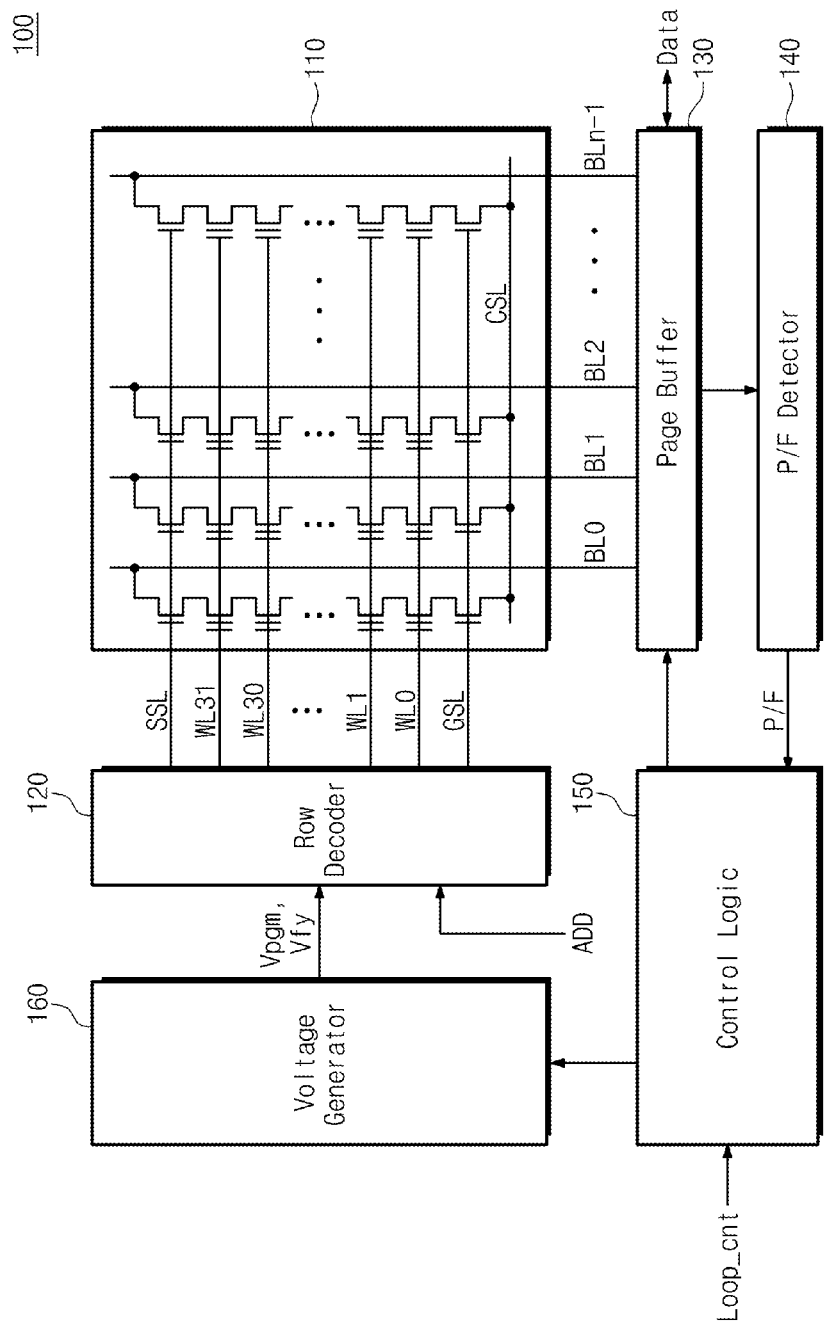
FIG. 1 is a block diagram illustrating a nonvolatile memory device according to an embodiment of the inventive concept.

Embodiments of the inventive concept are described below with reference to the accompanying drawings. These embodiments are presented as teaching examples and should not be construed to limit the scope of the inventive concept.

In the description that follows, the terms "first", "second", "third", etc., may be used to describe various elements, components, regions, layers and/or sections, but these elements, components, regions, layers and/or sections should not be limited by these terms. Rather, these terms are used merely to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the drawings. The spatially relative terms are intended to encompass different orientations of the device in use or operation in addition to the orientation depicted in the drawings. For example, where the device in the drawings is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, where a layer is referred to as being "between" two layers, it can be the only layer between the two layers, or one or more intervening layers may also be present.

The terminology used herein is for the purpose of describing particular embodiments only and is not intended to limit the inventive concept. As used herein, the singular forms "a", "an" and "the" are intended to include the plural forms as well, unless the context clearly indicates otherwise. The terms "comprises" and/or "comprising," where used in this specification, indicate the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Where an element or layer is referred to as being "on", "connected to", "coupled to", or "adjacent to" another element or layer, it can be directly on, connected, coupled, or adjacent to the other element or layer, or intervening elements or layers may be present. In contrast, where an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art. It will be further understood that terms such as those defined in commonly used dictionaries should be interpreted as having a meaning that is consistent with their meaning in the context of the relevant art and/or the present specification and will not be interpreted in an idealized or overly formal sense unless expressly so defined herein.

In the description that follows, the term "slow bit" refers to a data bit sensed from a memory cell having a threshold voltage that has not increased sufficiently in a program operation and that has been determined to be substantially program-failed in a verification operation. The term "fail bit" refers to sense data erroneously read from memory cells in a read operation.

FIG. 1 is a block diagram illustrating a nonvolatile memory device 100 according to an embodiment of the inventive concept.

Referring to FIG. 1, nonvolatile memory device 100 comprises a cell array 110, a row decoder 120, a page buffer 130, a pass/fail detector 140, control logic 150, and a voltage generator 160. Nonvolatile memory device 100 is configured to increase or decrease the number of slow bits corresponding to a specific target state.

Cell array 110 is connected with row decoder 120 through word lines WL0 to WL31 and selection lines SSL and GSL. Cell array 110 is connected with page buffer 130 through bit lines BL0 to BLn−1. Cell array 110 comprises a plurality of NAND cell strings each having a channel formed in a vertical or horizontal direction. Word lines WL0 to WL31 of cell array 110 are stacked in a vertical direction.

Row decoder 120 selects one of memory blocks of cell array 110 in response to an address ADD. Row decoder 120 selects one of word lines of the selected memory block and transfers a voltage provided from voltage generator 160 to the selected word line. In a program operation, row decoder 120 transfers a program voltage Vpgm and verification voltage Vfy to the selected word line and a pass voltage to unselected word lines.

Page buffer 130 acts as a write driver or a sense amplifier according to a mode of operation. In a program operation, page buffer 130 transfers a bit line voltage corresponding to data to be programmed to a bit line of cell array 110, and it senses and latches programmed data through bit lines BL0 to BLn−1. Data latched at page buffer 130 in a verification operation is transferred to pass/fail detector 140. In a read operation, page buffer 130 transfers the sensed and latched data to an external device via an input/output buffer (not shown).

Pass/fail detector 140 determines whether a program operation is successful based on a result of a verification operation executed in a program operation. A verification read operation is a type of read operation in which verification voltage Vfy is provided to a word line connected with selected memory cells. Data latched by page buffer 130 in the verification read operation is provided to pass/fail detector 140 but not to an external device. Pass/fail detector 140 determines whether a program operation is passed or failed based on the read data provided from page buffer 130.

Control logic 150 responds to a pass/fail result P/F provided from pass/fail detector 140 to determine an end of a program operation. For example, where pass/fail result P/F indicates program fail, control logic 150 controls page buffer 130 and voltage generator 160 to execute a next program loop. Control logic 150 comprises a loop counter to perform a program operation according to a variation in the number of program loops. Where the pass/fail result P/F indicates program pass, a program operation is ended under the control of control logic 150.

Voltage generator 160 operates under control of control logic 150 to generate a variety of word line voltages to be supplied to word lines and a voltage to be supplied to a bulk (e.g., a well area) where memory cells are formed. The word line voltages to be supplied to the word lines may include, for instance, program voltage Vpgm, verification voltage Vfy, the pass voltage, selection and non-selection read voltages, and so on. Voltage generator 160 generates selection line voltages to be provided to selection lines SSL and GSL at read and program operations.

In a program operation, voltage generator 160 varies a verification voltage on a specific state according to the number of program loops or a level of a program voltage. For example, voltage generator 160 may generate a first verification voltage Vfy from a first program loop to a specific program loop and a second verification voltage Vfy' after the specific program loop, that is, in the remaining program loops. Second verification voltage Vfy' may be lower than first verification voltage Vfy. A variation in the verification voltage may be performed with respect to memory cells to be programmed to a specific target state. Alternatively, a variation in the verification voltage according to the number of program loops may be applied to all target states by making decreasing levels of target states become different from one another.

In a program operation, selected memory cells are programmed to a target state (e.g., P3 in a 2-bit MLC) corresponding to a relatively higher threshold voltage distribution using more program loops compared with the remaining target states P1 and P2. The number of slow bits generated when selected memory cells are programmed to a target state P3 may increase. This may mean that the number of program loops increases. Where the number of slow bits is within an allowable error correction capacity, voltage generator 160 is controlled such that a program operation is passed although slow bits exist.

As indicated by the description of FIG. 1, nonvolatile memory device 100 can vary a level of a verification voltage according to a target state, the number of program loops, a level of a program voltage, and so on. Thus, it is possible to prevent the number of program loops from being excessively increased by slow bits.

Figure 2:
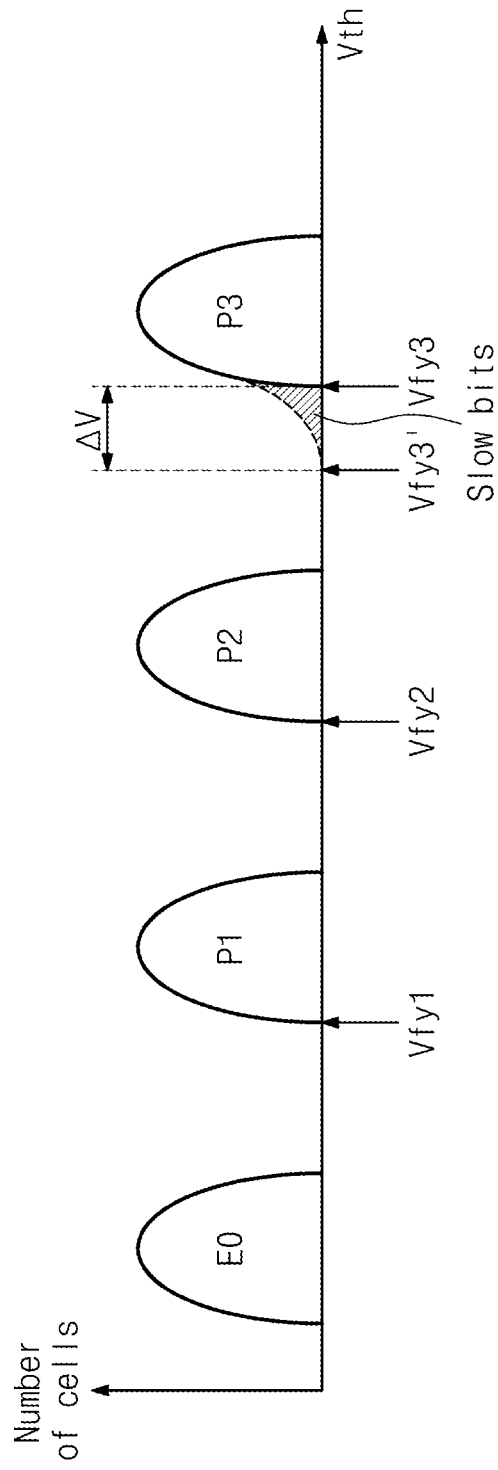
FIG. 2 is a threshold voltage diagram illustrating threshold voltage distributions of 2-bit MLCs.

FIG. 2 is a threshold voltage diagram illustrating threshold voltage distributions of 2-bit multi-level cells.

Referring to FIG. 2, verification voltages Vfy3 and Vfy3' are used to bypass slow bits associated with memory cells to be programmed to a specific target state P3. Where a program operation is executed, memory cells may have an erase state or one of program states P1, P2, and P3.

In the program operation, a program voltage is applied to a selected word line. Then, verification is performed to determine whether memory cells are programmed to program states P1, P2, and P3. Verification voltages Vfy1, Vfy2, and Vfy3 or Vfy3' corresponding respectively to program states P1, P2, and P3 are applied to the selected word line. Memory cells programmed to program state P3 in view of the number of slow bit tolerance (SBT) are verified using one of verification voltages Vfy3 and Vfy3'. For example, where a current program loop is below a reference program loop, verification voltage Vfy3 may be used. Where the current program loop is over the reference program loop, verification voltage Vfy3' may be used. Verification voltage Vfy3' may be used as a verification voltage on a program voltage having a level higher than a reference level.

A difference ΔV between verification voltage Vfy3 and verification voltage Vfy3' may be determined according to the number of slow bit tolerance SBT. For example, a level of verification voltage Vfy3' may be determined in view of trade-off between slow bit tolerance SBT on program state P3 and the number of fail bits suppressed by reduction of the number of program loops. Although the above description presents potential benefits with respect to program state P3, the inventive concept is not limited thereto. For example, adjusting of verification voltages performed in view of the number of SBT can be applied to program states P1 and P2 according to a level of a program voltage or the number of program loops.

Figure 3:
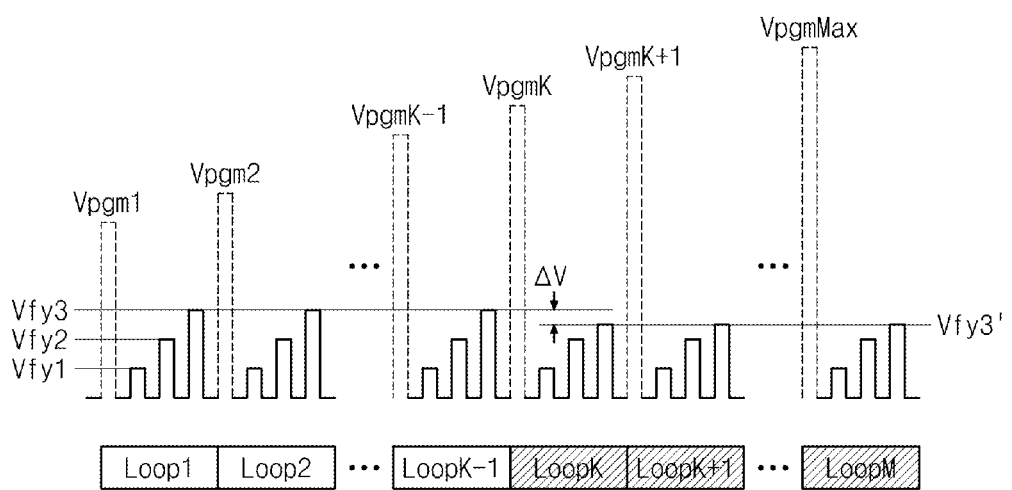
FIG. 3 is a diagram illustrating a program voltage and verification voltages for a program operation of a nonvolatile memory device according to an embodiment of the inventive concept.

FIG. 3 is a diagram illustrating a program voltage and verification voltages for a program operation of a nonvolatile memory device according to an embodiment of the inventive concept.

Referring to FIG. 3, in a program operation, a program voltage Vpgmi is applied to a selected word line, and verification voltages on target states P1, P2, and P3 are applied to the selected word line in sequence.

During a first program loop, a program voltage Vpgm1, which is a start program voltage, is applied to the selected word line. Then, verification voltages Vfy1, Vfy2, and Vfy3 corresponding respectively to target states P1, P2, and P3 are applied to the selected word line in sequence.

Where each of verification voltages Vfy1, Vfy2, and Vfy3 corresponding respectively to target states P1, P2, and P3 is applied to the selected word line, a page buffer 130 senses whether selected memory cells are turned on or off. The sensed data is provided to pass/fail detector 140. Where data sensed using each of verification voltages Vfy1, Vfy2, and Vfy3 is determined not to be program passed, a second program loop may be executed in which a program voltage Vpgm2 higher than program voltage Vpgm1 is applied to the selected word line. A program voltage and verification voltages may be provided to the selected word line as indicated by the foregoing description.

In the event that a current program loop reaches a specific program loop LoopK or program voltage Vpgmi reaches a specific program voltage VpgmK, a level of a verification voltage on a target state P3 may be changed. For example, verification voltage Vfy3 on target state P3 may be changed into a verification voltage Vfy3' determined in view of an SBT.

Pass/fail detector 140 determines memory cells having threshold voltages higher than verification voltage Vfy3' and lower than verification voltage Vfy3 to be program passed. Verification voltage Vfy3' is used in the remaining program loops.

Although the above description presents an example in which slow bit tolerance SBT is applied with respect to target state P3, the inventive concept is not limited thereto. For example, slow bit tolerance SBT can be applied to target states P1 and P2 in a similar manner.

Figure 4:
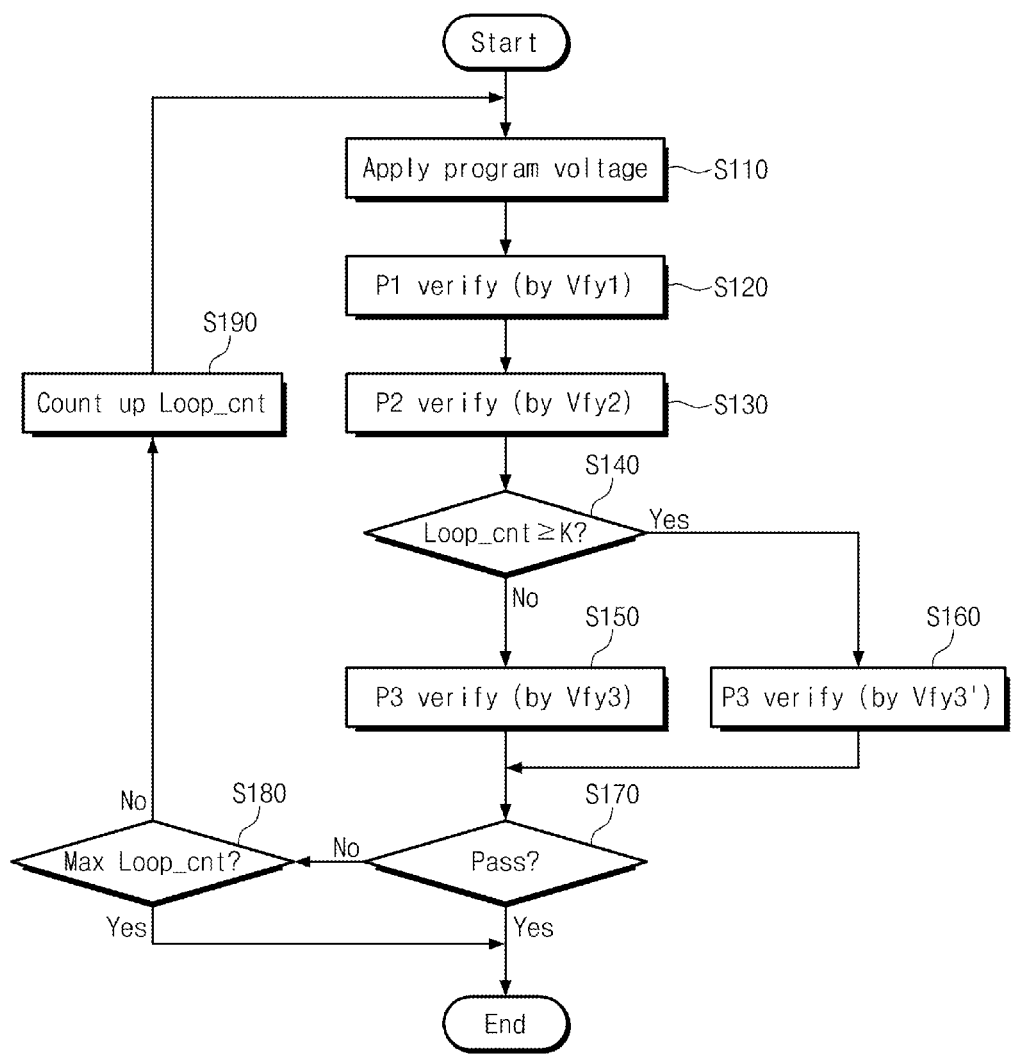
FIG. 4 is a flowchart illustrating a method of programming a nonvolatile memory device according to an embodiment of the inventive concept.

FIG. 4 is a flowchart illustrating a method of programming a nonvolatile memory device according to an embodiment of the inventive concept. In a program operation, different levels of slow bit tolerances SBT may be applied to target states P1, P2, and P3, respectively.

Referring to FIG. 4, in an operation S110, a program voltage Vpgm1 is applied to a word line connected with selected memory cells. Herein, the selected memory cells may be multi-level cells.

Thereafter, in an operation S120, a verification read operation on a target state P1 is executed. At this time, a verification voltage Vfy1 is applied to the word line. Memory cells to be programmed to target state P1 are sensed as an on-cell or an off-cell by a page buffer 130.

Then, in an operation S130, a verification read operation on a target state P2 is executed. At this time, a verification voltage Vfy2 is applied to the word line. Memory cells to be programmed to target state P2 are sensed as on-cells or off-cells by page buffer 130.

Next, an operation S140 determines whether a value Loop_cnt indicating the number of program loops reaches a reference K. Where the value Loop_cnt is determined not to reach reference K (S140=No), the method proceeds to an operation S150. In operation S150, a verification read operation is executed regardless of slow bit tolerance SBT on memory cells to be programmed to target state P3. Where the value Loop_cnt is determined to reach reference K (S140=Yes), the method proceeds to an operation S160. In operation S160, a verification read operation is executed in view of slow bit tolerance SBT on memory cells to be programmed to target state P3.

In operation S150, a verification voltage Vfy3 is applied to the word line connected with the selected memory cells. Memory cells to be programmed to target state P3 are sensed as on-cells or off-cells by page buffer 130.

In operation S160, a verification voltage Vfy3' is applied to the word line connected with the selected memory cells. Memory cells to be programmed to target state P3 are sensed as on-cells or off-cells by page buffer 130.

In an operation S170, verification read results on the selected memory cells are transferred to pass/fail detector 140 from page buffer 130. Pass/fail detector 140 determines the program operation to be failed where the verification read results indicate that at least one memory cell is an on-cell. Where the selected memory cells are determined to be off-cells, pass/fail detector 140 determines the program operation to be passed. Afterwards, the method terminates.

Where the program operation is determined to be failed, the method proceeds to an operation S180. In operation S180, control logic 150 determines whether the value Loop_cnt reaches a maximum value Max Loop_cnt. Where the value Loop_cnt is determined to reach maximum value Max Loop_cnt (S180=Yes), the method terminates. Otherwise (S180=No), the method proceeds to an operation S190.

In operation S190, the value Loop_cnt indicating the number of program loops is incremented, or counted up, and the method proceeds to operation S110 to execute a program loop corresponding to increased value Loop_cnt.

The above description presents an example in which different levels of slow bit tolerances SBT are applied to target states. Where a value indicating the number of program loops associated with memory cells to be programmed to a specific target state (e.g., P3) reaches a reference, a verification voltage is adjusted to be lower than a verification voltage used in previous program loops. It is possible to apply different levels of slow bit tolerances with respect to a plurality of target states by controlling a verification voltage as described above.

Figure 5:
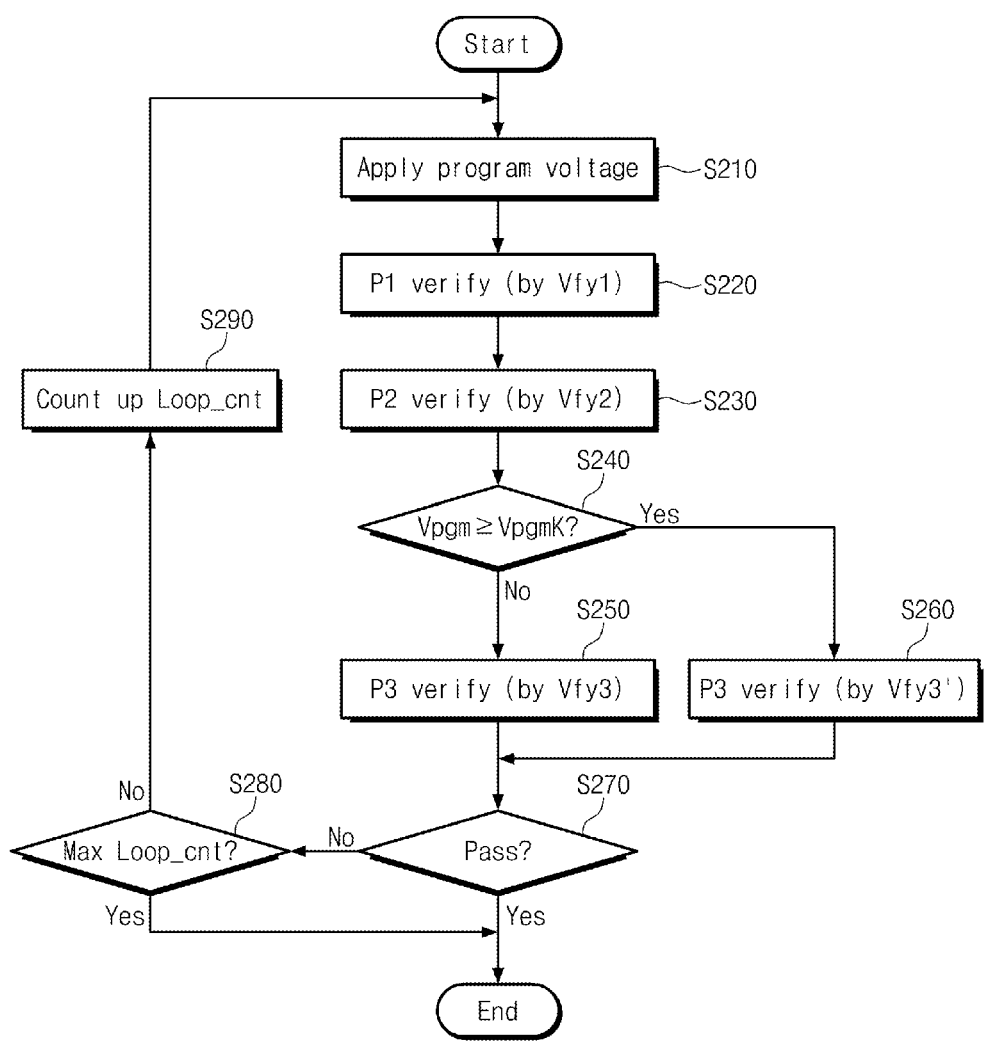
FIG. 5 is a flowchart illustrating a method of programming a nonvolatile memory device according to another embodiment of the inventive concept.

FIG. 5 is a flowchart illustrating a method of programming a nonvolatile memory device according to another embodiment of the inventive concept. In a program operation, different levels of slow bit tolerances SBT may be applied to target states P1, P2, and P3, respectively.

In an operation S210, a program voltage Vpgm1 is applied to a word line connected with selected memory cells. Herein, the selected memory cells may be multi-level cells.

Next, in an operation S220, a verification read operation is performed for a target state P1. At this time, a verification voltage Vfy1 is applied to the word line. Memory cells to be programmed to target state P1 are sensed as on-cells or off-cells by page buffer 130.

Thereafter, in an operation S230, a verification read operation is performed for a target state P2. At this time, a verification voltage Vfy2 is applied to the word line. Memory cells to be programmed to target state P2 are sensed as on-cells or off-cells by page buffer 130.

Next, an operation S240 determines whether program voltage Vpgm1 reaches a specific level VpgmK. Where program voltage Vpgm1 is determined not to reach the specific level VpgmK (S240=No), the method proceeds to an operation S250. In operation S250, a verification read operation is executed regardless of slow bit tolerance SBT on memory cells to be programmed to target state P3. Where program voltage Vpgm1 is determined to reach the specific level VpgmK (S240=Yes), the method proceeds to an operation S260. In operation S260, a verification read operation is executed in view of slow bit tolerance SBT on memory cells to be programmed to target state P3.

In operation S250, a verification voltage Vfy3 is applied to the word line connected with the selected memory cells. Memory cells to be programmed to target state P3 are sensed as on-cells or off-cells by page buffer 130.

In operation S260, a verification voltage Vfy3' is applied to the word line connected with the selected memory cells. Memory cells to be programmed to target state P3 are sensed as on-cells or off-cells by page buffer 130.

In an operation S270, verification read results on the selected memory cells are transferred to pass/fail detector 140 from page buffer 130. Pass/fail detector 140 determines the program operation to be failed when the verification read results indicate that at least one memory cell is an on-cell. Where the selected memory cells are determined to be off-cells, pass/fail detector 140 may determine the program operation to be passed. Afterwards, the method terminates.

Where the program operation is determined to be failed, the method proceeds to operation S280. In operation S280, control logic 150 determines whether the value Loop_cnt reaches a maximum value Max Loop_cnt. Where the value Loop_cnt is determined to reach maximum value Max Loop_cnt (S280=Yes), the method terminates. Otherwise, where the value Loop_cnt is determined not to reach maximum value Max Loop_cnt (S280=No), the method proceeds to an operation S290.

In operation S290, the value Loop_cnt indicating the number of program loops is incremented, or counted up. The method then proceeds to operation S210 to execute a program loop corresponding to increased value Loop_cnt.

In the example of FIG. 5, different levels of slow bit tolerances SBT are applied to target states. Where a program voltage applied to memory cells to be programmed to a specific target state (e.g., P3) reaches a reference level, a verification voltage is adjusted to be lower than a verification voltage used at previous program loops. It is possible to apply different levels of slow bit tolerances with respect to target states.

Figure 6:
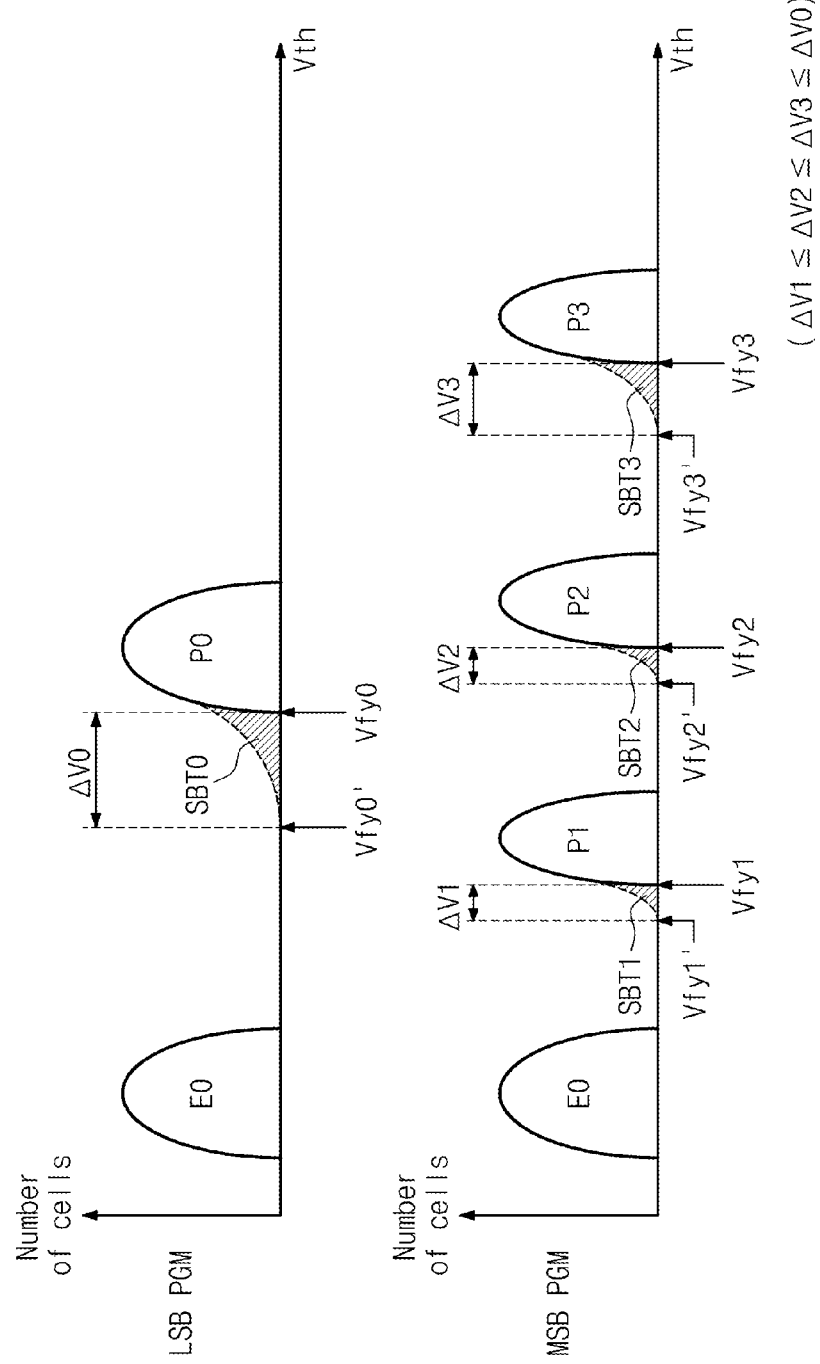
FIG. 6 is a threshold voltage diagram illustrating a method of programming a nonvolatile memory device according to an embodiment of the inventive concept.

FIG. 6 is a threshold voltage diagram illustrating a method of programming a nonvolatile memory device according to an embodiment of the inventive concept.

Referring to FIG. 6, different levels of slow bit tolerances SBT are used according to a page (e.g., an LSB or MSB page) to be programmed at multi-level cells. For ease of description, a program operation of 2-bit multi-level cells will be described. However, the inventive concept is not limited thereto. For example, the inventive concept can be applied to a program operation of multi-level cells capable of storing three or more data bits.

Where an LSB page is programmed at selected memory cells, a slashed portion SBT0 in FIG. 6 indicates a slow bit tolerance SBT0 of a target state P0. Verification voltages Vfy0 and Vfy0' are used to bypass slow bits on target state P0 at the LSB page programming operation. Herein, verification voltage Vfy0' is selected to bypass slow bits on target state P0. Where the number of program loops or a level of a program voltage is below a reference at the LSB page programming operation, verification voltage Vfy0 is used in a verification operation of target state P0. Where the number of program loops or a level of a program voltage is over the reference at the LSB page programming operation, verification voltage Vfy0' is used in a verification operation on target state P0. Herein, a difference ΔV between verification voltages Vfy0 and Vfy0' is determined according to the number of slow bit tolerance SBT0.

In the example of FIG. 6, verification voltages and slow bit tolerances STB1, SBT2, and SBT3 are used where an MSB page is programmed to the selected memory cells. In general, a slow bit tolerance can be applied to each of target states P1, P2, and P3 at an MSB page programming operation. However, for explanation purposes, as in FIG. 2, a slow bit tolerance is shown being applied only to a target state (e.g., P3) at the MSB page programming operation.

A verification voltage Vfy1' for applying a slow bit tolerance SBT1 is assigned to target state P1. Herein, a difference ΔV1 between verification voltages Vfy1 and Vfy1' is determined according to the number of slow bit tolerance SBT1. For example, a level of verification voltage Vfy1' may be determined through testing or simulation. A verification voltage Vfy2' for applying a slow bit tolerance SBT2 may be assigned to target state P2. Herein, a difference ΔV2 between verification voltages Vfy2 and Vfy2' may be determined according to the number of slow bit tolerance SBT2. Herein, the difference ΔV2 may be equal to or larger than the difference ΔV1. A verification voltage Vfy3' for applying a slow bit tolerance SBT3 is assigned to target state P3. Herein, a difference ΔV3 between verification voltages Vfy3 and Vfy3' may be determined according to the number of slow bit tolerance SBT3. Herein, the difference ΔV3 may be equal to or larger than the difference ΔV2.

The probability that a read error is generated by slow bits at the LSB page programming operation may be lower than the probability that a read error is generated by slow bits at the MSB page programming operation. The reason may be that a read margin between target states E0 and P0 at the LSB page programming operation is larger than that among target states E0, P1, P2, and P3 at the MSB page programming operation. Slow bit tolerance SBT0 applied at the LSB page programming operation may be set to be equal to or more than the slow bit tolerance (SBT1+SBT2+SBT3) applied at the MSB page programming operation. In this case, it is possible to remarkably improve a program speed of the LSB page.

Herein, sizes of slow bit tolerances SBT0, SBT1, SBT2, and SBT3 applied respectively to target states P0, P1, P2, and P3 are merely examples. Thus, a difference between a verification voltage Vfyi' for applying a slow bit tolerance with respect to each target state and a verification voltage Vfy may not be limited to the condition (ΔV1≤ΔV2≤ΔV3≤ΔV0) illustrated in FIG. 6.

Figure 7:
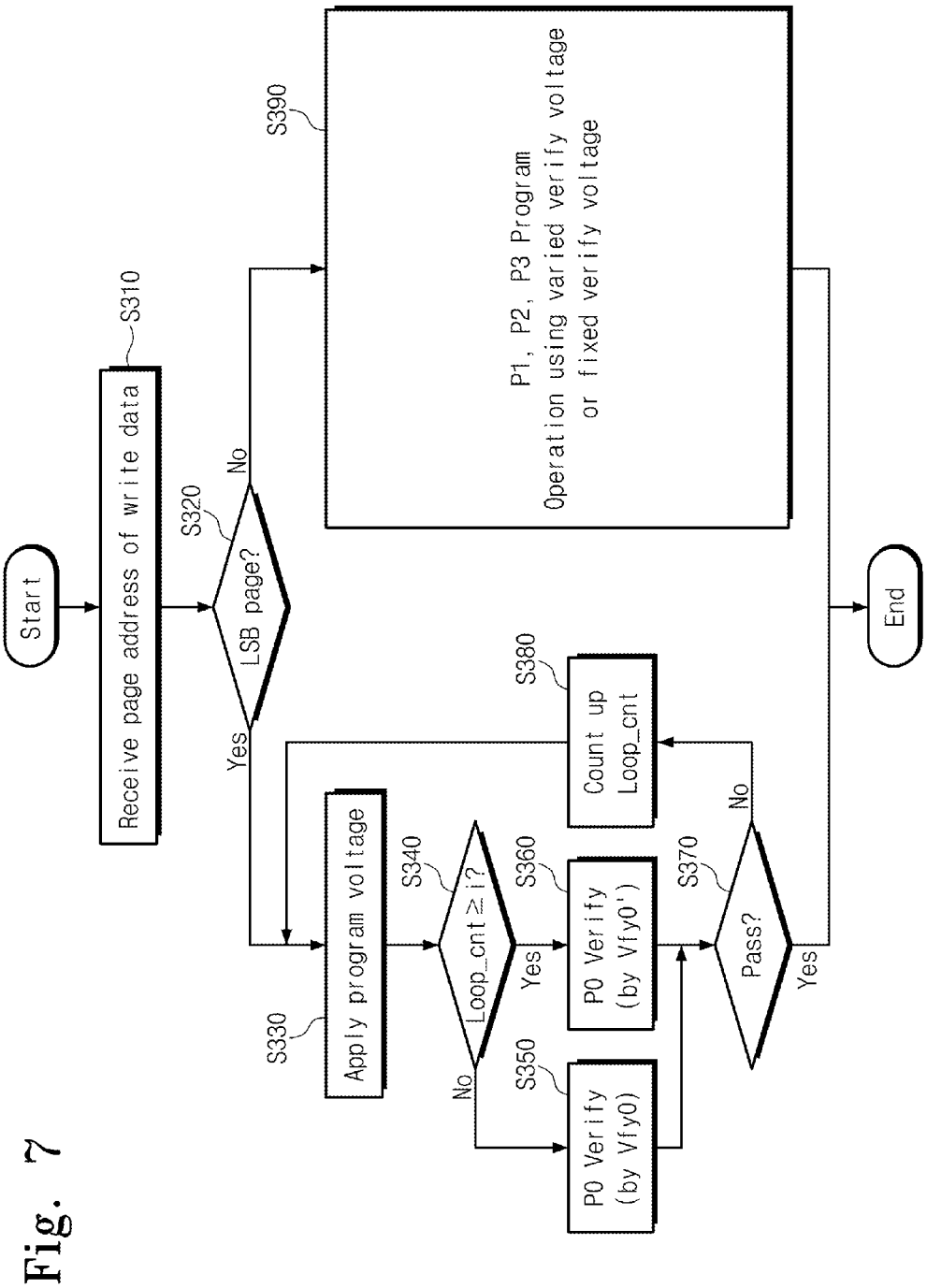
FIG. 7 is a flowchart illustrating a method of programming a nonvolatile memory device according to still another embodiment of the inventive concept.

FIG. 7 is a flowchart illustrating a method of programming a nonvolatile memory device according to still another embodiment of the inventive concept. The method of FIG. 7 will be explained with reference to FIGS. 6 and 7. In this method, detecting and determining operations to which different levels of slow bit tolerances SBT are applied may be performed according to a page address in a program operation.

Referring to FIGS. 6 and 7, in an operation S310, a nonvolatile memory device 100 may receive an address for programming, and may detect a page address by decoding an address corresponding to write data.

In operation S320, control logic 150 determines whether the page address corresponds to an LSB page or an MSB page. Where the page address corresponds to an LSB page, the method proceeds to operation S330 in which a relatively large slow bit tolerance SBT is applied to a target state P0. Where the page address corresponds to an MSB page, the method proceeds to an operation S390 in which different levels of slow bit tolerances SBT are applied to target states P1, P2, and P3.

In operation S330, a program voltage is applied to a word line connected with selected memory cells. The selected memory cells are memory cells connected with the same word line. Next, in an operation S340, a current program loop number Loop_cnt is detected. Where the current loop number Loop_cnt is below a reference i, the method proceeds to an operation S360. Otherwise, where the current loop number Loop_cnt is below a reference i, the method proceeds to an operation S350. Where the current loop number Loop_cnt is equal to or more than the reference i, the method proceeds to operation S360.

In operation S350, a verification read operation is performed for target state P0. At this time, a verification voltage Vfy0 is applied to the word line connected with the selected memory cells. Memory cells to be programmed to target state P0 are sensed as on-cells or off-cells by a page buffer 130.

In operation S360, a verification read operation is performed for target state P0. At this time, a verification voltage Vfy0' is applied to the word line connected with the selected memory cells. Memory cells to be programmed to target state P0 are sensed as on-cells or off-cells by page buffer 130.

In an operation S370, verification read results of the selected memory cells are transferred to pass/fail detector 140 from page buffer 130. Pass/fail detector 140 determines the program operation to be failed where the verification read results indicate that at least one memory cell is an on-cell. Where the selected memory cells are determined to be off-cells, pass/fail detector 140 determines the program operation to be passed. Afterwards, the method terminates.

Where the program operation is determined to be failed, the method proceeds to operation S380. In operation S380, control logic 150 increments the current loop number Loop_cnt. Then, the method proceeds to operation S330 to perform a program loop corresponding to the incremented loop number. Control logic 150 may be used to determine whether the current loop number reaches a maximum value Max Loop_cnt.

In an operation S390, the MSB page is programmed. Herein, the selected memory cells are verified using verification voltages Vfy1 or Vfy1', Vfy2 or Vfy2', and Vfy3 or Vfy3'. There may be performed a verification read operation in which different levels of slow bit tolerances SBT are applied to target states P1, P2, and P3 of the selected memory cells. This may be performed the same or substantially the same as described above with reference to FIG. 4.

In the example of FIG. 7, different levels of slow bit tolerances are applied to memory cells according to a page address. A program speed of an LSB page may be remarkably improved by applying a larger slow bit tolerance to the LSB page in which the probability that an error is generated is low.

Figure 8:
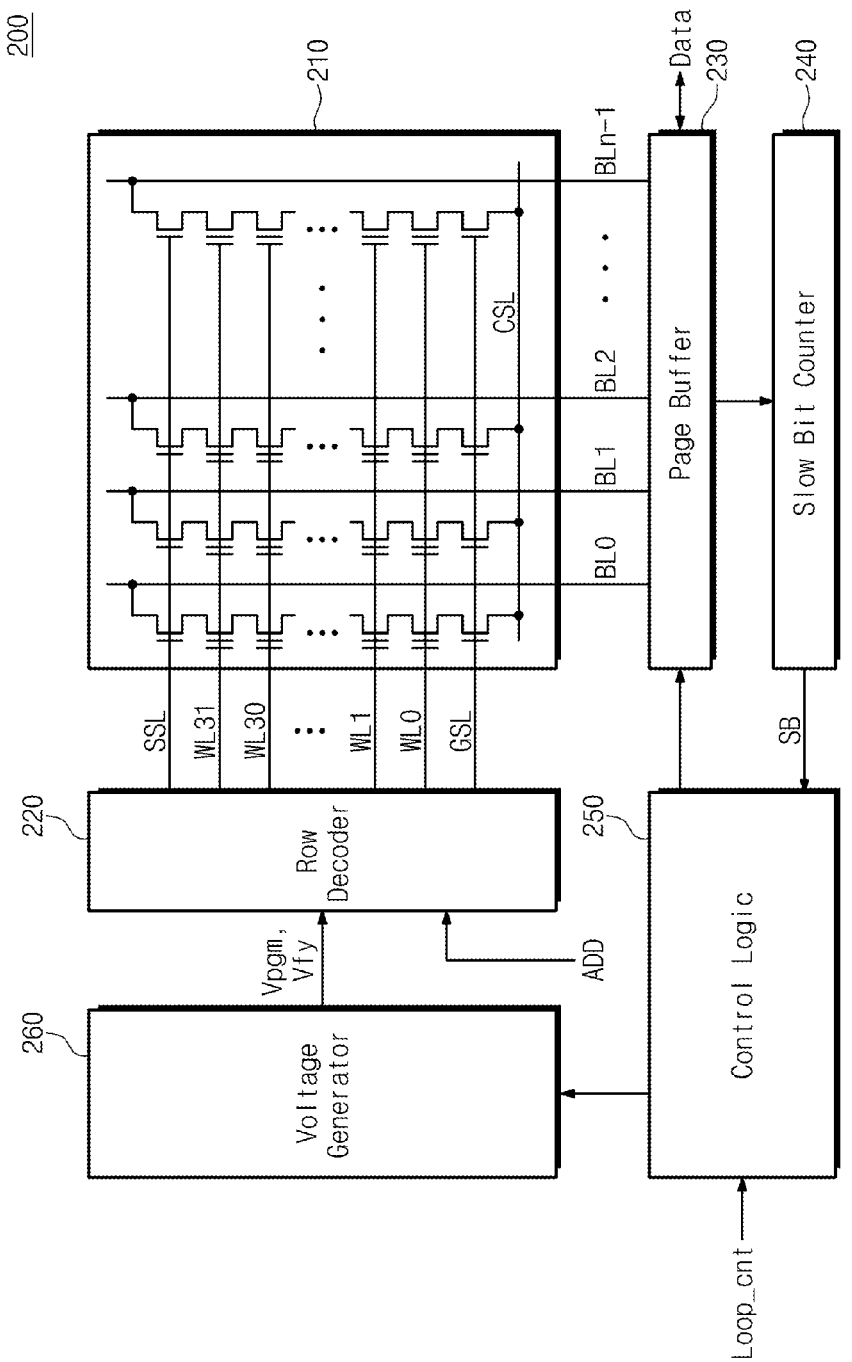
FIG. 8 is a block diagram illustrating a nonvolatile memory device according to another embodiment of the inventive concept.

FIG. 8 is a block diagram illustrating a nonvolatile memory device 200 according to another embodiment of the inventive concept.

Referring to FIG. 8, a nonvolatile memory device 200 comprises a cell array 210, a row decoder 220, a page buffer 230, a slow bit counter 240, control logic 250, and a voltage generator 260. The features 210, 220, and 230 may be configured the same or substantially the same as corresponding features in FIG. 1, so a description of these features will be omitted in order to avoid redundancy. Nonvolatile memory device 200 is configured to apply different levels of slow bit tolerances SBT to target areas by counting the number of slow bits, not varying a verification voltage, as described in further detail below.

In a verification read operation, slow bit counter 240 counts slow bits based on a read result provided from page buffer 230. Slow bit counter 240 provides control logic 250 with the counted slow bit number SB. Herein, slow bit counter 240 counts slow bits associated with respective target states P0, P1, P2, and P3 in a verification read operation. For example, in the event that an LSB page is programmed, slow bit counter 240 counts the number of slow bits on target state P0 and transfer it to control logic 250. In the event that an MSB page is programmed, slow bit counter 240 counts the number of slow bits on each of target states P1, P2, and P3 to transfer it to control logic 250.

Control logic 250 may determine an end of a program operation based on the counted slow bit number SB provided from slow bit counter 240. Control logic 250 controls page buffer 230 and voltage generator 260 according to the counted slow bit number SB on each of the target state provided from slow bit counter 240 so as to perform a program operation. For example, control logic 250 may perform a program operation in which different levels of slow bit tolerances SBT are applied to the target states, respectively.

Where the number of detected slow bits is over slow bit tolerance SBT, control logic 250 may control page buffer 230 and voltage generator 260 such that a next program operation is performed using a program voltage increased by an increment. Control logic 250 may be provided with a loop count Loop_cnt to perform a program operation according to an increased loop number. Where the number of detected slow bits is equal to or lower than slow bit tolerance SBT, control logic 250 may terminate a program operation.

Voltage generator 260 generates a verification voltage having a fixed level with respect to one target state in a program operation. In a first program loop, voltage generator 260 generates fixed levels of verification voltages on target states P0, P1, P2, and P3 regardless of the number of program loops or a level of a program voltage. It is possible to measure the number of slow bits corresponding to a target state without varying of a verification voltage. Thus, proper slow bit tolerances may be applied to target states according to the number of detected slow bits.

Nonvolatile memory device 200 applies different levels of slow bit tolerances to target states by counting slow bits on the respective target states. Thus, it is possible to reduce the number of program loops which are excessively increased by slow bits.

Figure 9:
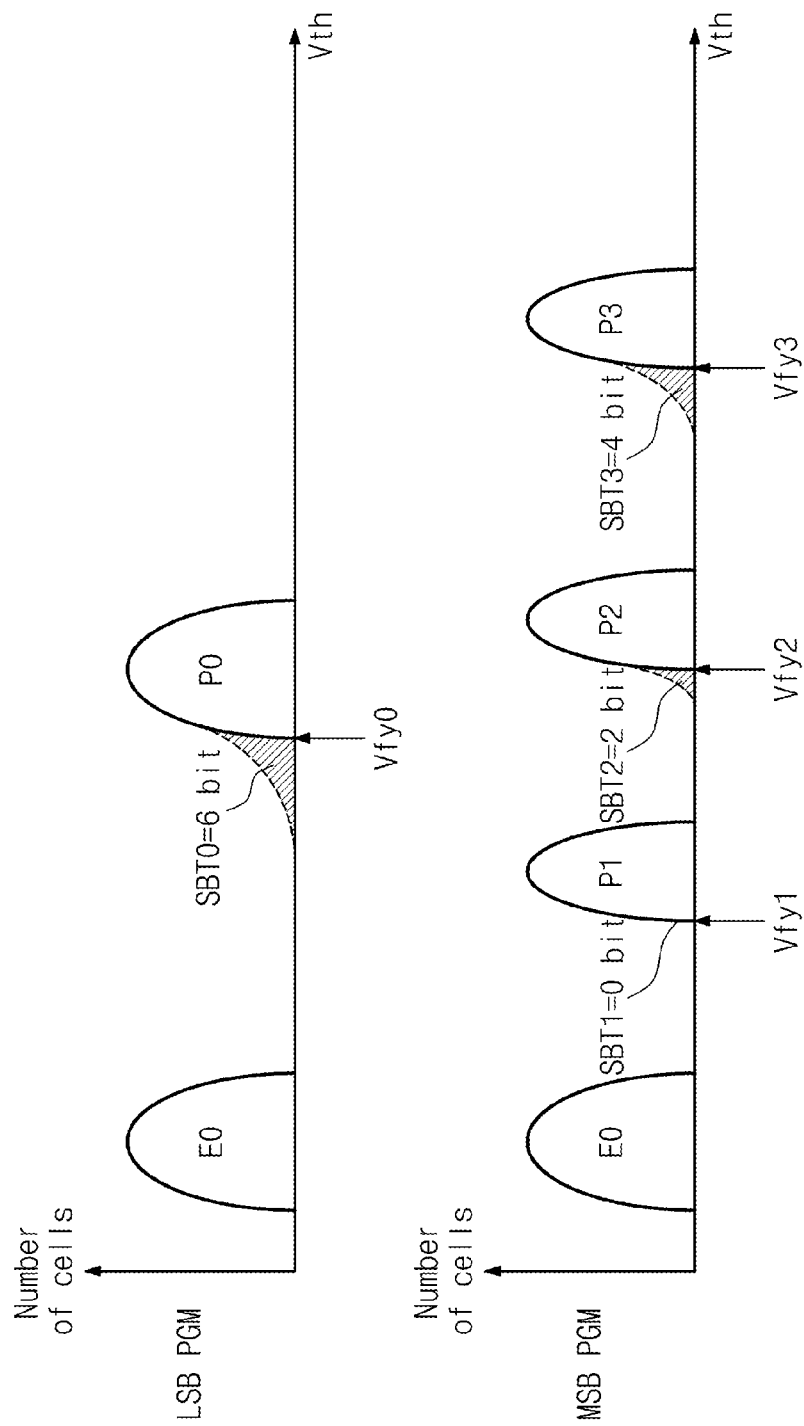
FIG. 9 is a threshold voltage diagram illustrating a method of programming a nonvolatile memory device in which slow bit tolerances are applied differently according to an embodiment of the inventive concept.

FIG. 9 is a threshold voltage diagram illustrating a method of programming a nonvolatile memory device in which slow bit tolerances are applied differently according to an embodiment of the inventive concept. For explanation purposes, the method of FIG. 9 will be described with reference to nonvolatile memory device 200 of FIG. 8.

Referring to FIG. 9, nonvolatile memory device 200 is configured to apply different levels of slow bit tolerances without adjusting of verification voltages on target states P0, P1, P2, and P3. In the method of FIG. 9, different levels of slow bit tolerances are applied to a page address and target states.

For explanation purposes, it is assumed that a slow bit tolerance SBT0 on a target state P0 is formed of six bits when an LSB page is programmed at selected memory cells. A level of a verification voltage Vfy0 on target state P0 may be fixed regardless of an increase in the number of program loops. Under these conditions, in an LSB page programming operation, control logic 250 determines a program operation to be completed where the number of detected slow bits is below 6, and the program operation terminates.

Verification voltages and slow bit tolerances SBT1, SBT2, and SBT3 where an MSB page is programmed at selected memory cells are illustrated at a lower portion of FIG. 9. In the described example, different levels of slow bit tolerances are applied to target states P1, P2, and P3 in an MSB page programming operation. However, as described with reference to FIG. 2, a slow bit tolerance is applied only to a target state (e.g., P3) in an MSB page programming operation.

As illustrated in FIG. 9, a slow bit tolerance SBT1 being 0-bit may be applied to target state P1, a slow bit tolerance SBT2 being 2-bit may be applied to target state P2, and a slow bit tolerance SBT3 being 4-bit may be applied to target state P3. Verification voltages Vfy1, Vfy2, and Vfy3 on target states P1, P2, and P3 may be fixed regardless of an increase in the number of program loops.

In the example of FIG. 9, a slow bit tolerance SBT0 (6-bit) applied to the LSB page programming operation is the same as a sum (6-bit) of slow bit tolerances (SBT1+SBT2+SBT3) applied to the MSB page programming operation. However, the inventive concept is not limited thereto. For example, slow bit tolerances can be determined variously according to a characteristic of nonvolatile memory device 200 or its operating environment and deterioration.

Figure 10:
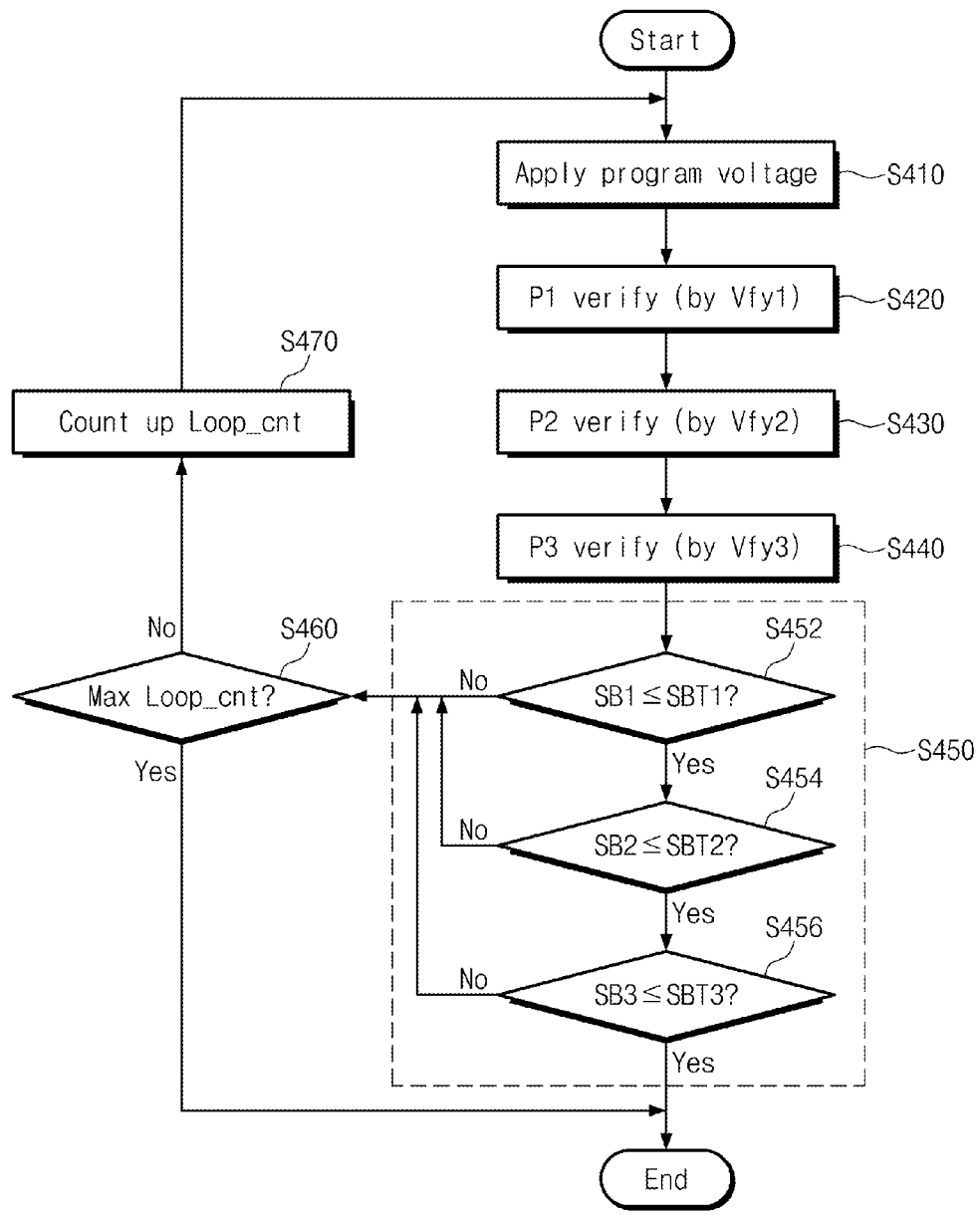
FIG. 10 is a flowchart illustrating a method of programming a nonvolatile memory device according to still another embodiment of the inventive concept.

FIG. 10 is a flowchart illustrating a method of programming a nonvolatile memory device according to still another embodiment of the inventive concept. For convenience, the method of FIG. 10 will be described with reference to FIGS. 8 through 10.

Referring to FIGS. 8 through 10, different levels of slow bit tolerances SBT are applied to target states P1, P2, and P3 in an MSB page programming operation. To avoid redundancy, a description on an LSB page programming operation will be skipped.

In an operation S410, a program voltage is applied to a word line connected with selected memory cells. The selected memory cells may be multi-level cells memory cells connected with the same word line.

Next, in an operation S420, a verification read operation is performed on a target state P1. At this time, a verification voltage Vfy1 is applied to the word line. Memory cells to be programmed to target state P1 are sensed as on-cells or off-cells by page buffer 230.

In an operation S430, a verification read operation is performed on a target state P2. At this time, a verification voltage Vfy2 is applied to the word line. Memory cells to be programmed to target state P2 are sensed as on-cells or off-cells by page buffer 230.

In an operation S440, a verification read operation is performed on a target state P3. At this time, a verification voltage Vfy3 is applied to the word line. Memory cells to be programmed to target state P3 are sensed as on-cells or off-cells by page buffer 230.

In an operation S450, control logic 250 determines whether program operations to which slow bit tolerances SBT1, SBT2, and SBT3 are applied to target states P1, P2, and P3 are completed. For example, where the number of detected slow bits on at least one of target states P1, P2, and P3 is over a slow bit tolerance, the method proceeds to operation S460. Where counted slow bit numbers of target states P1, P2, and P3 are equal to or less than corresponding slow bit tolerances SBT1, SBT2, and SBT3, control logic 250 terminates the program operation.

Operation S450 may include operations S452, S454, and S456. For example, in operation S452, control logic 250 may determine whether the counted slow bit number SB1 on target state P1 is equal to or less than slow bit tolerance SBT1. If so, the method proceeds to operation S454. Otherwise, the method proceeds to operation S460.

In operation S454, control logic 250 determines whether the counted slow bit number SB2 on target state P2 is equal to or less than slow bit tolerance SBT2. If so, the method proceeds to operation S456. Otherwise, the method proceeds to operation S460.

In operation S456, control logic 250 determines whether the counted slow bit number SB3 on target state P3 is equal to or less than slow bit tolerance SBT3. If so, the program operation terminates. Otherwise, the method proceeds to operation S460.

In operation S460, control logic 250 determines whether a value Loop_cnt indicating a current program loop reaches a maximum value Max Loop_cnt. Where the value Loop_cnt is determined to reach maximum value Max Loop_cnt, the method terminates. Otherwise, where the value Loop_cnt is determined not to reach maximum value Max Loop_cnt, the method proceeds to an operation S470.

In operation S470, the value Loop_cnt may be incremented, or counted up. The method proceeds to operation S410 to execute a program loop corresponding to the increased value Loop_cnt.

As indicated by the foregoing, in the method of FIG. 10, slow bits on each target state are counted and the number of the counted slow bits on each target state is compared with a corresponding slow bit tolerance. Thus, it is possible to apply different levels of slow bit tolerances to target states, respectively.

Figure 11:
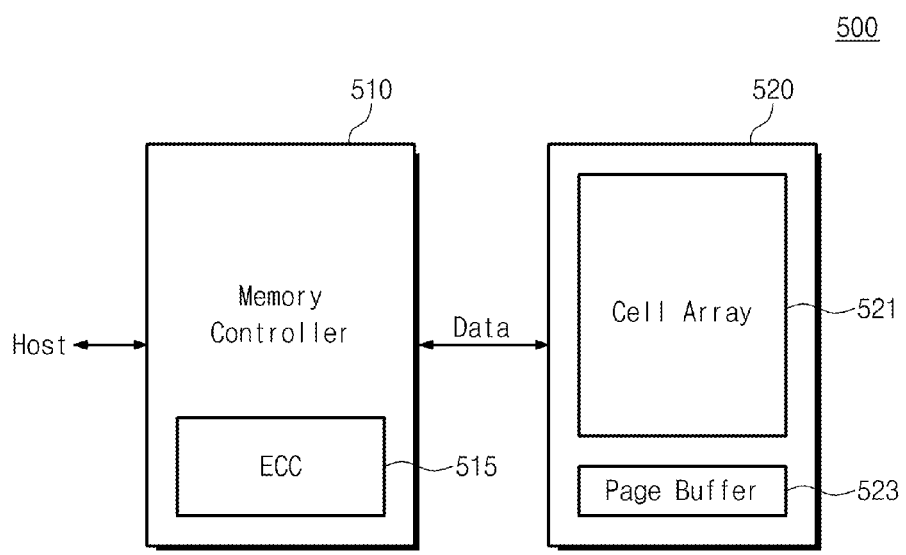
FIG. 11 is a block diagram illustrating a memory system according to an embodiment of the inventive concept.

FIG. 11 is a block diagram illustrating a memory system 500 according to an embodiment of the inventive concept.

Referring to FIG. 11, memory system 500 comprises a memory controller 510 and a nonvolatile memory device 520. Memory controller 510 has an error correction capacity sufficient for a slow bit tolerance SBT of nonvolatile memory device 520.

Memory controller 510 controls nonvolatile memory device 520 based on a command and an address provided from an external device. Where a write request is received from a host, memory controller 510 performs an encoding operation on write requested data. Memory controller 510 may control nonvolatile memory device 520 such that the encoded data is programmed at a memory area corresponding to the input address. Memory controller 510 decodes data output from nonvolatile memory device 520 in a read operation. An error in the output data may be corrected by the decoding operation. Memory controller 510 comprises an error correction code (ECC) block 515 to perform the decoding and encoding operations.

Nonvolatile memory device 520 comprises a cell array 521 and a page buffer 523. Nonvolatile memory device 520 is configured to apply different levels of slow bit tolerances to target states, respectively. For example, nonvolatile memory device 520 may change a verification voltage on a target state based on the number of program loops or a level of a program voltage. Alternatively, nonvolatile memory device 520 may provide a constant verification voltage regardless of the number of program loops or a level of a program voltage, and may count slow bits on each target state to applying different levels of slow bit tolerances. Herein, assigning and determining of slow bit tolerances may be made within an error correction capacity of ECC block 515.

Figure 12:
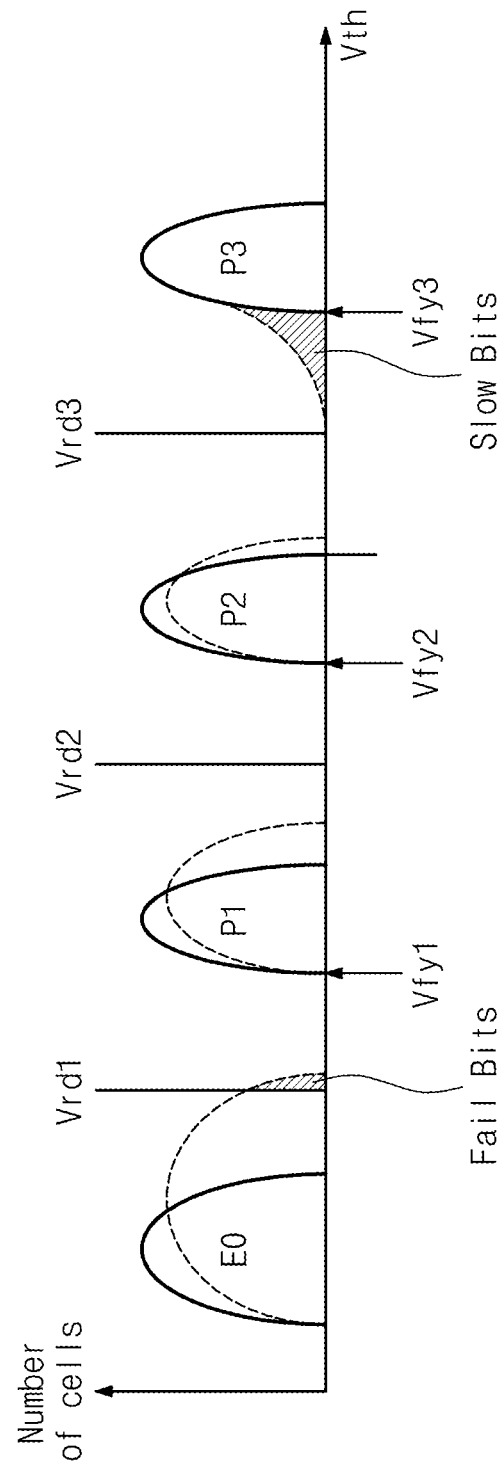
FIG. 12 is a diagram illustrating an effect programming a nonvolatile memory device according to an embodiment of the inventive concept.

FIG. 12 is a diagram illustrating an effect programming a nonvolatile memory device according to an embodiment of the inventive concept. As illustrated in FIG. 12, fail bits are generated according to an increase in the number of program loops and slow bits are generated according to a decrease in the number of program loops.

As the number of program loops increases, threshold voltages of memory cells corresponding to a target state (e.g., E0) may increase by the program disturbance or interference. In a worst case, threshold voltages of memory cells corresponding to target state E0 may exceed a read voltage Vrd1. In this case, the memory cells may be determined to be a program state P1, not an erase state E0. Data bits read from the memory cells may be fail bits. Data bits read from memory cells when the number of program loops is insufficient or data bits read from memory cells having threshold voltages lower than a verification voltage Vfy3 due to characteristics of memory cells may be slow bits. A slow bit tolerance may be used to tolerate slow bits which are generated within an error correction range.

In certain embodiments of the inventive concept, a level of a slow bit tolerance SBT is determined in view of the number of fail bits. Accordingly, slow bits generated by a decrease in the number of program loops may be compensated by a decrease in the number of fail bits. Thus, it is possible to improve a program speed without additional burden of an ECC block 515 (see, e.g., FIG. 11). Also, error bits when the number of slow bits increases may be adjusted variously within an error correction capacity of ECC block 515.

Figure 13:
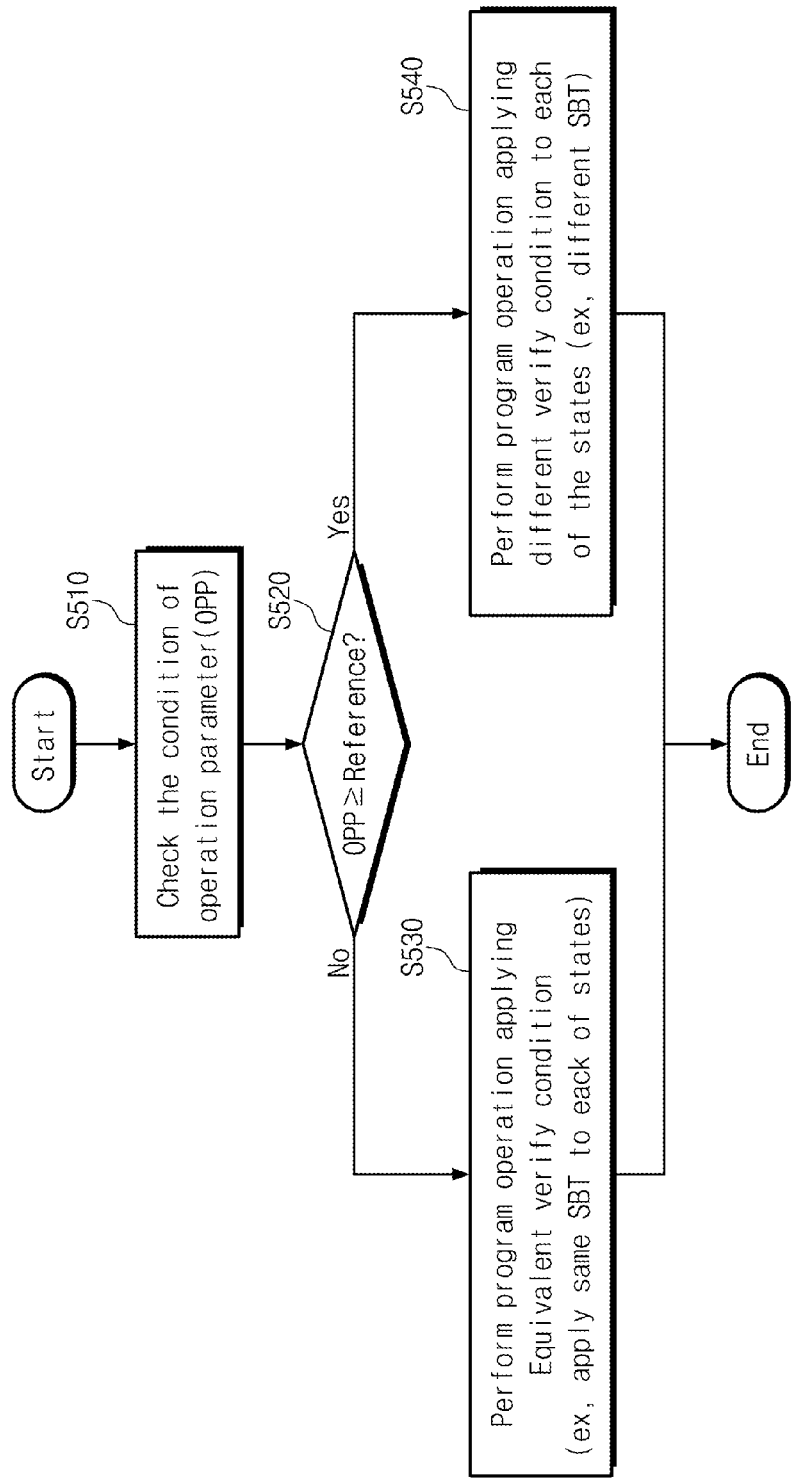
FIG. 13 is a flowchart illustrating a method of programming a nonvolatile memory device according to still another embodiment of the inventive concept.

FIG. 13 is a flowchart illustrating a method of programming a nonvolatile memory device according to still another embodiment of the inventive concept. For convenience, the method of FIG. 13 is explained with reference to memory system 500 of FIG. 11. In the example of FIG. 13, nonvolatile memory device 520 is configured to apply or adjust a slow bit tolerance SBT in view of conditions of operation parameters (OPP). Herein, operation parameters OPP may include an operation temperature, a process variation, deterioration of memory cells, and so on.

Referring to FIG. 13, in an operation S510, memory controller 510 checks an operation parameter condition. Where operation parameter OPP is an operation temperature, a current temperature is detected by a temperature sensor of a memory system 500. Where operation parameter OPP indicates deterioration of memory cells, wear-leveling information may be detected.

In an operation S520, memory controller 510 determines whether operation parameter OPP is below a reference value.

Where operation parameter OPP is below the reference value, the method proceeds to an operation S540. Otherwise, where operation parameter OPP is not below the reference, the method proceeds to an operation S530.

In operation S530, nonvolatile memory device 520 performs a program operation in which the same slow bit tolerance SBT is applied to target states, respectively. Alternatively, nonvolatile memory device 520 may perform a program operation in which a verification voltage is fixed regardless of an increase in the number of program loops with respect to target states.

In operation S540, nonvolatile memory device 520 performs a program operation in which different levels of slow bit tolerances SBT are applied to target states, respectively. Alternatively, nonvolatile memory device 520 may perform a program operation in which a verification voltage is changed according to an increase in the number of program loops or an increase in a program voltage.

Figure 14:
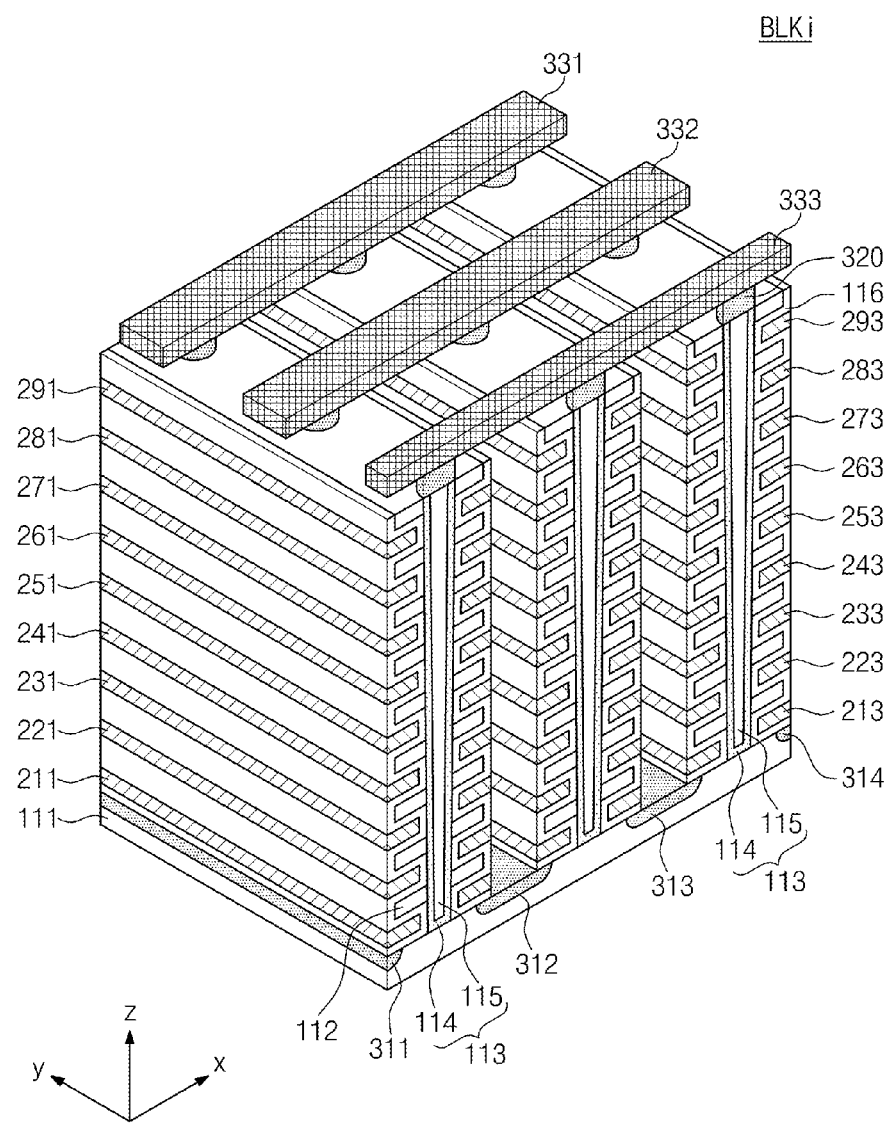
FIG. 14 is a perspective view illustrating an example memory block in a cell array of FIG. 1 or 8.

FIG. 14 is a perspective view illustrating one of memory blocks of a cell array in FIG. 1 or 8.

Referring to FIG. 14, a memory block BLKi of a cell array 110 or 210 comprises cell strings formed in a three-dimensional or vertical structure. Memory block BLKi comprises structures extending along a plurality of directions x, y, and z.

A substrate 111 is provided to form memory block BLK1. Substrate 111 is formed of a p-well in which boron is injected, for example. Alternatively, substrate 111 may be a pocket p-well provided within an n-well. Below, it is assumed that substrate 111 is a p-well. However, substrate 111 is not limited to a p-well.

On substrate 111 between the first and second doping regions 311 and 312, a plurality of insulation materials 112 extending along the y-direction may be provided sequentially along the z-direction. Insulation materials 112 are formed to be spaced apart along the z-direction. For example, the insulation materials may include an insulation material such as silicon oxide.

On substrate 111 between the first and second doping regions 311 and 312, a plurality of pillars 113 is arranged sequentially along the y-direction so as to penetrate insulation materials 112 along the z-direction. For example, pillars 113 may contact with substrate 111 through insulation materials 112. Herein, pillars 113 may also be formed on substrate 111 between the second and third doping regions 312 and 313 and on the substrate between third and fourth doping regions 313 and 314.

In some embodiments, each pillar 113 may be formed of a plurality of materials. For example, a surface layer 114 of each pillar 113 may comprise a first type of silicon material. For example, surface layer 114 of each pillar 113 may comprise a silicon material having the same type as substrate 111. Below, it is assumed that surface layer 114 of each pillar 113 includes p-type silicon. However, surface layer 114 of each pillar 113 is not limited to the p-type silicon.

An inner layer 115 of each pillar 113 may be formed of an insulation material. For example, inner layer 115 of each pillar 113 may comprise an insulation material such as silicon oxide. Alternatively, inner layer 115 of each pillar 113 may include air gap.

An insulation film 116 is provided between the first and second doping regions 311 and 312 along exposed surfaces of insulation materials 112, pillars 113, and substrate 111. In some embodiments, insulation film 116 can be removed which is provided on an exposed surface (toward the third direction z) of last insulation material 112 provided along the z-direction.

In a region between the first and second doping regions 311 and 312, first conductive materials 211 to 291 are provided on an exposed surface of insulation film 116, respectively. For example, first conductive material 211 extending along the y-direction may be provided between substrate 111 and insulation material 112 adjacent to substrate 111. In further detail, first conductive material 211 extending in the x-direction may be provided between substrate 111 and insulation film 116 of a lower surface of insulation material 112 adjacent to substrate 111.

The first conductive material extending along the y-direction may be provided between insulation film 116 on an upper surface of a specific insulation material of insulation materials 112 and insulation film 116 on a lower surface of an insulation material disposed at an upper portion of the specific insulation material. In example embodiments, each of first conductive materials 211 to 291 may include a metal material. For example, each of first conductive materials 211 to 291 may include a conductive material such as polysilicon.

The same structure as that on the first and second doping regions 311 and 312 may be provided between the second and third doping regions 312 and 313. For example, between the second and third doping regions 312 and 313, there may be provided a plurality of insulation materials 112 extending in the y-direction, a plurality of pillars 113 disposed sequentially along the y-direction so as to penetrate insulation materials 112 along the x-direction, an insulation film 116 provided on exposed surfaces of pillars 113 and insulation materials 112, and a plurality of first conductive materials 212 to 292 extending along the y-direction.

The same structure as that on the first and second doping regions 311 and 312 may be provided at an area between the third and fourth doping regions 313 and 314. For example, at an area between the third and fourth doping regions 313 and 314, there may be provided a plurality of insulation materials 112 extending in the y-direction, a plurality of pillars 113 disposed sequentially along the y-direction so as to penetrate insulation materials 112 along the z-direction, an insulation film 116 provided on exposed surfaces of pillars 113 and insulation materials 112, and a plurality of conductive materials 213 to 293 extending along the y-direction.

Drains 320 are provided on pillars 113, respectively. Drains 320 are second-type silicon materials. For example, drains 320 may be n-type silicon materials. In the following description, it is assumed that drains 320 include n-type silicon materials, although they are not limited to n-type silicon materials. A width of each drain 320 may be wider than that of a corresponding pillar 113. Each drain 320 may be provided on an upper surface of a corresponding pillar 113 in a pad shape, for example.

Conductive materials 331 to 333 extending along the x-direction are provided on respective drains 320. Conductive materials 331 to 333 are disposed sequentially along the y-direction. Conductive materials 331 to 333 are connected with corresponding drains 320. For example, drains 320 and conductive material 333 extending along the x-direction may be connected via corresponding contact plugs. Each of conductive materials 331 to 333 typically comprises a metallic material, although they may be formed of other conductive materials such as such as polysilicon.

Figure 15:
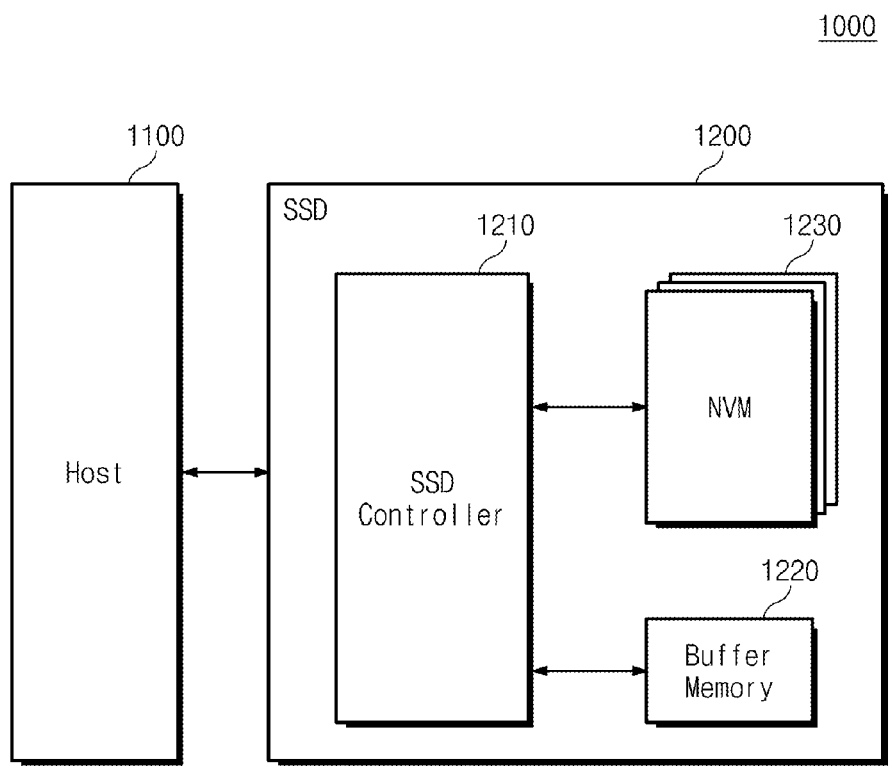
FIG. 15 is a block diagram illustrating a system comprising a solid state drive according to an embodiment of the inventive concept.

FIG. 15 is a block diagram illustrating a system 1000 comprising a solid state drive according to an embodiment of the inventive concept.

Referring to FIG. 15, system 1000 comprises a host 1100 and a solid state drive (SSD) 1200. SSD 1200 comprises an SSD controller 1210, a buffer memory 1220, and a nonvolatile memory device 1230.

SSD controller 1210 provides physical interconnection between host 1100 and SSD 1200. SSD controller 1210 also provides an interface with SSD 1200 corresponding to a bus format of host 1100. In particular, SSD controller 1210 decodes a command provided from host 1100 and accesses nonvolatile memory device 1230 according to a result of the decoding. A bus format of host 1100 may be, for instance, Universal Serial Bus (USB), Small Computer System Interface (SCSI), PCI express, ATA, Parallel ATA (PATA), Serial ATA (SATA), or Serial Attached SCSI (SAS).

Buffer memory 1220 temporarily stores write data provided from host 1100 or data read out from nonvolatile memory device 1230. Where data existing in nonvolatile memory device 1230 is cached at a read request of host 1100, buffer memory 1220 may support a cache function of providing cached data directly to host 1100. Typically, a data transfer speed of a bus format (e.g., SATA or SAS) of host 1100 may be higher than that of a memory channel of SSD 1200. Where an interface speed of host 1100 is remarkably fast, lowering of the performance due to a speed difference may be minimized by providing buffer memory 1220 having a large storage capacity.

Buffer memory 1220 is typically formed of a synchronous DRAM to provide sufficient buffering to SSD 1200 used as an auxiliary mass storage device. However, buffer memory 1220 is not limited to this disclosure.

Nonvolatile memory device 1230 may be provided as a storage medium of SSD 1200. For example, nonvolatile memory device 1230 may be formed of a vertical NAND flash memory device having a mass storage capacity. Nonvolatile memory device 1230 may be configured the same or substantially the same as that illustrated in FIG. 1 or 8. Nonvolatile memory device 1230 may have a high-speed program property by applying different levels of slow bit tolerances to target states.

Nonvolatile memory device 1230 may be formed of a plurality of memory devices. In this case, memory devices may be connected to SSD controller 1210 by a channel unit. As a storage medium, nonvolatile memory device 1230 may be formed of a NAND flash memory. However, nonvolatile memory device 1230 is not limited to a NAND flash memory device. For example, a storage medium of SSD 1200 can be formed of a PRAM, an MRAM, a ReRAM, a FRAM, a NOR flash memory, and the like. Further, the inventive concept may be applied to a memory system which uses different types of memory devices together.

Figure 16:
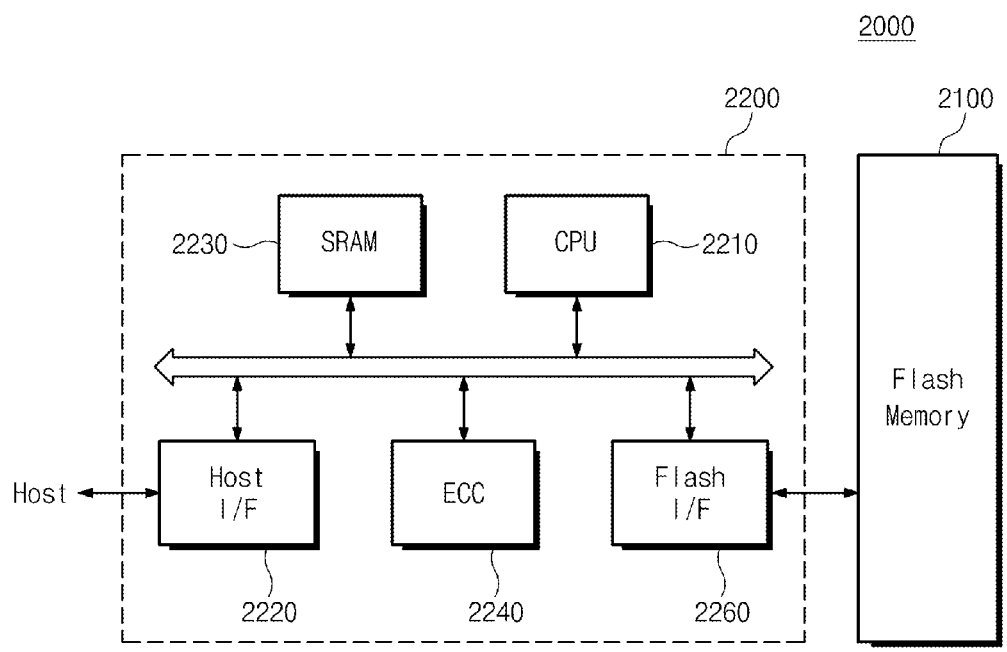
FIG. 16 is a block diagram illustrating a memory system according to another embodiment of the inventive concept.

FIG. 16 is a block diagram illustrating a memory system 2000 according to another embodiment of the inventive concept.

Referring to FIG. 16, memory system 2000 comprises a flash memory 2100 and a memory controller 2200.

Flash memory 2100 may be configured the same or substantially the same as memory devices illustrated in FIG. 1 or 8, for instance. Flash memory 2100 may have one of various alternative structures, such as, e.g., a stack flash structure in which multiple arrays are stacked, a source-drain free flash structure, a pin-type flash structure, and a three-dimensional flash structure. Flash memory 2100 may have a high-speed program property by applying different levels of slow bit tolerances to target states.

Memory controller 2200 is configured to control nonvolatile memory 2100. An SRAM 2230 is used as a working memory of a CPU 2210. A host interface 2220 implements a data exchange protocol of a host connected with memory system 2000. An ECC block 2240 is configured to detect and correct errors included in data read out from nonvolatile memory 2100. A memory interface 2260 interfaces with nonvolatile memory 2100. CPU 2210 executes an overall control operation for data exchange of memory controller 2200. Although not shown in FIG. 16, memory system 2000 may further include a ROM to store code data for interfacing with the host. Memory controller 2200 can communicate with an external device (e.g., host) using a standardized interface protocols such as USB, MMC, PCI-E, SAS, SATA, PATA, SCSI, ESDI, or IDE.

In some embodiments, memory system 2000 may comprise a computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

Figure 17:
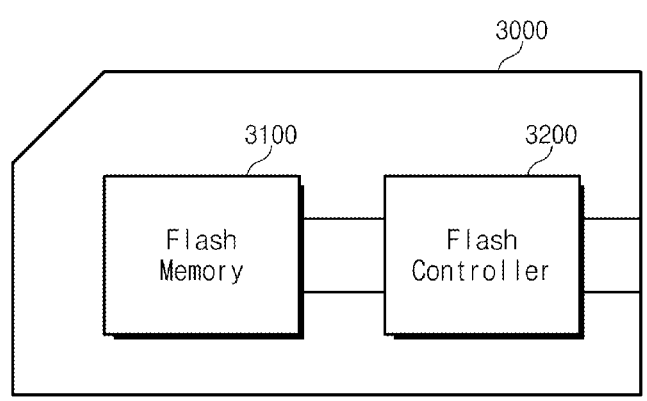
FIG. 17 is a block diagram illustrating a data storage device according to still another embodiment of the inventive concept.

FIG. 17 is a block diagram illustrating a data storage device 3000 according to still another embodiment of the inventive concept.

Referring to FIG. 17, a data storage device 3000 may include a flash memory 3100 and a flash controller 3200. Flash controller 3200 may control flash memory 3100 in response to control signals input from the outside of data storage device 3000.

Flash memory device 3100 of FIG. 17 may be configured similar to devices illustrated in FIG. 1 or 8. Flash memory device 3100 may be one selected from a group of a stack flash structure in which multiple arrays are stacked, a source-drain free flash structure, a pin-type flash structure, and a three-dimensional flash structure. Flash memory device 3100 may have a high-speed program property by applying different levels of slow bit tolerances to target states.

Data storage device 3000 may be a memory card device, an SSD device, a multimedia card device, an SD device, a memory stick device, a HDD device, a hybrid drive device, or an USB flash device. For example, data storage device 3000 may be a card which satisfies a standard for using a user device such as a digital camera, a personal computer, and the like.

Figure 18:
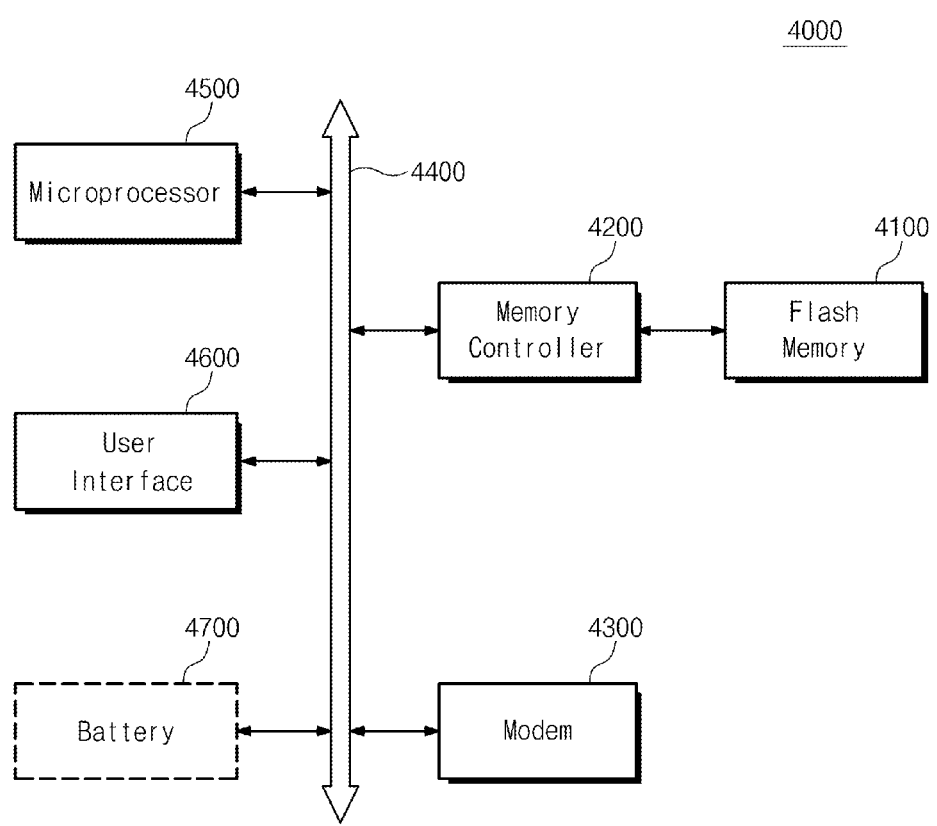
FIG. 18 is a block diagram illustrating a computing system comprising a flash memory device according to an embodiment of the inventive concept.

FIG. 18 is a block diagram illustrating a computing system comprising a flash memory device according to an embodiment of the inventive concept.

Referring to FIG. 18, a computing system 4000 may include a flash memory device 4100, a memory controller 4200, a modem 4300 such as a baseband chipset, a microprocessor 4500, and a user interface 4600. Elements 4200, 4300, 4500, and 4600 may be electrically connected to a bus 4400.

Flash memory device 4100 may be configured the same or substantially the same as devices illustrated in FIG. 1 or 8, for instance. Flash memory device 4100 can take any of various forms, such as a stack flash structure in which multiple arrays are stacked, a source-drain free flash structure, a pin-type flash structure, or a three-dimensional flash structure, for example. Flash memory device 4100 may have a high-speed program property by applying different levels of slow bit tolerances to target states.

Where computing system 4000 is a mobile device, it may further comprise a battery 4700 which powers computing system 4000. Although not shown in FIG. 18, computing system 4000 may further comprise other features such as an application chipset, a camera image processor (CIS), a mobile DRAM, and the like. Memory controller 4200 and flash memory device 4100 may constitute a solid state drive/disk (SSD) which uses a nonvolatile memory to store data.

A nonvolatile memory device or a memory controller may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of programming selected memory cells to a plurality of target states, comprising:
   applying a first verification voltage to the selected memory cells to perform a verification read operation on memory cells programmed to at least one target state;
   applying a program voltage to the selected memory cells; and
   applying a second verification voltage lower than the first verification voltage to the selected memory cells to perform a verification read operation on memory cells programmed to the at least one target state, wherein the second verification voltage is provided in a specified program loop and subsequent program loops,
   wherein the second verification voltage is set such that a number of slow bits in the at least one target state is different from the number of slow bits in another target state.

2. The method of claim 1, wherein the at least one target state is a program state corresponding to an uppermost target state among the target states.

3. The method of claim 1, wherein the second verification voltage is lower than a threshold voltage of the at least one target state.

4. The method of claim 1, wherein a number of slow bits of a first target state among the target states is greater than or equal to a number of slow bits of a second target state lower than the first target state.

5. The method of claim 1, wherein a difference between the first verification voltage and the second verification voltage varies according to a page address of the selected memory cells.

6. The method of claim 5, wherein a difference between the first verification voltage and the second verification voltage corresponding to a first target state in programming of a least significant bit (LSB) page is larger than a difference between the first verification voltage and the second verification voltage corresponding to a second target state during programming of another page.

7. A nonvolatile memory device, comprising:
   a cell array comprising memory cells to be programmed to a plurality of target states;
   a page buffer configured to sense selected ones of the memory cells through bit lines;
   a voltage generator configured to provide a program voltage or a verification voltage to a word line connected to the selected memory cells; and
   control logic configured to control the page buffer and the voltage generator such that allowable slow bit numbers applied respectively to the target states are different from one another where the selected memory cells are programmed to at least one of the target states.

8. The nonvolatile memory device of claim 7, wherein the control logic controls the voltage generator such that a first verification voltage generated in one program loop is lower than a second verification voltage generated in another program loop before the one program loop.

9. The nonvolatile memory device of claim 8, wherein the control logic controls the voltage generator such that a difference between the first verification voltage and the second verification voltage is applied differently to the target states.

10. The nonvolatile memory device of claim 8, wherein the control logic controls the voltage generator such that a difference between the first verification voltage and the second verification voltage is applied differently to the target states according to a page address of the selected memory cells.

11. The nonvolatile memory device of claim 7, further comprising:
    a pass/fail detector configured to receive a verification read result from the page buffer to determine whether the selected memory cells are programmed to the at least one target state.

12. The nonvolatile memory device of claim 7, further comprising:
    a slow bit counter configured to receive a verification read result from the page buffer to count slow bits corresponding to memory cells, not programmed to the at least one target state, from among memory cells to be programmed to the at least one target state.

13. The nonvolatile memory device of claim 12, wherein the voltage generator generates a verification voltage having a fixed level with respect to the at least one target state.

14. The nonvolatile memory device of claim 13, wherein the control logic determines a program operation to be completed when the number of slow bits of at least one target state is equal to or less than the number of slow bits.

15. A method of programming a nonvolatile memory device, comprising:
    defining a slow bit tolerance for memory cells in the nonvolatile memory device;
    programming the memory cells to at least one target state by performing a plurality of program loops each comprising a program step and a verification step;
    during the programming, determining whether a number of the program loops or the program voltage has reached a predetermined level; and
    upon determining that the number of the program loops or the program voltage has reached the predetermined level, modifying a verification voltage for the at least one target state according to the slow bit tolerance.

16. The method of claim 15, wherein the at least one target state is a program state corresponding to an uppermost target state among the target states.

17. The method of claim 15, wherein modifying the verification voltage comprises changing it to a level that is lower than a threshold voltage of the at least one target state.

18. The method of claim 15, wherein the at least one target states comprise first and second target states, and a number of slow bits of the first target state is greater than or equal to a number of slow bits of the second target state, which is lower than the first target state.

19. The method of claim 15, wherein the slow bit tolerance varies according to a page address of the memory cells.

20. The method of claim 15, wherein the nonvolatile memory device is a multi-level cell flash memory device.

* * * * *